(12) United States Patent
Onaka et al.

(10) Patent No.: US 11,112,662 B2
(45) Date of Patent: Sep. 7, 2021

(54) BLACK MATRIX SUBSTRATE AND DISPLAY DEVICE

(71) Applicant: TOPPAN PRINTING CO., LTD., Tokyo (JP)

(72) Inventors: Nozomi Onaka, Taito-ku (JP); Kenzo Fukuyoshi, Taito-ku (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/135,176

(22) Filed: Dec. 28, 2020

(65) Prior Publication Data

US 2021/0149259 A1    May 20, 2021

Related U.S. Application Data

(63) Continuation of application No. PCT/JP2018/024079, filed on Jun. 26, 2018.

(51) Int. Cl.
*G02F 1/1362* (2006.01)
*G02F 1/1333* (2006.01)
(Continued)

(52) U.S. Cl.
CPC ...... *G02F 1/136209* (2013.01); *G02F 1/1368* (2013.01); *G02F 1/13338* (2013.01);
(Continued)

(58) Field of Classification Search
CPC .......... G02F 1/136209; G02F 1/13338; G02F 1/136286; G02F 1/1368; H01L 27/1225; H01L 27/1248
(Continued)

(56) References Cited

U.S. PATENT DOCUMENTS

2013/0271689 A1* 10/2013 Kim .................... G06F 3/0446
349/44

FOREIGN PATENT DOCUMENTS

JP            3418479 B2    6/2003
JP       2013-222202 A    10/2013
(Continued)

OTHER PUBLICATIONS

International Search Report dated Aug. 7, 2018 in PCT/JP2018/024079, filed Jun. 26, 2018 (with English Translation).

*Primary Examiner* — Charles S Chang
(74) *Attorney, Agent, or Firm* — Oblon, McClelland, Maier & Neustadt, L.L.P.

(57) ABSTRACT

A black matrix substrate includes a black dielectric layer formed on a transparent substrate, a first insulating layer formed on the black dielectric layer, a first conductive layer formed on the first insulating layer and including a first conductive pattern, a second insulating layer formed on the first conductive pattern, an oxide semiconductor layer formed on the second insulating layer, a second conductive layer formed on the oxide semiconductor layer and the second insulating layer, the second conductive layer including a second conductive pattern, a transparent resin layer formed on the second conductive pattern, and a light-absorbing layer formed on the transparent resin layer. The black dielectric layer includes carbon and covers the first and second conductive patterns in a plan view. The light-absorbing layer includes carbon and covers the first and second conductive patterns in a plan view.

12 Claims, 21 Drawing Sheets

(51) Int. Cl.
  *H01L 27/12* (2006.01)
  *G02F 1/1368* (2006.01)
(52) U.S. Cl.
  CPC .... *G02F 1/136286* (2013.01); *H01L 27/1225* (2013.01); *H01L 27/1248* (2013.01)
(58) Field of Classification Search
  USPC ...................................... 349/42–48, 110–111
  See application file for complete search history.

(56) References Cited

FOREIGN PATENT DOCUMENTS

| | | | |
|---|---|---|---|
| JP | 2015-215606 A | 12/2015 | |
| JP | 2017-054926 A | 3/2017 | |

\* cited by examiner

BLACK MATRIX SUBSTRATE AND DISPLAY DEVICE

CROSS-REFERENCE TO RELATED APPLICATIONS

The present application is a continuation of International Application No. PCT/JP2018/024079, filed Jun. 26, 2018, the entire contents of which are incorporated herein by reference.

BACKGROUND OF THE INVENTION

Field of the Invention

The present invention relates to a black matrix substrate having a touch sensing function, and a display device using the black matrix substrate.

Discussion of the Background

Display devices such as smartphones and tablets having a capacitive touch sensing function, capable of direct input on a display screen with a finger or pointer, are becoming common. Known touch sensing functions use an on-cell method or an in-cell method. In the former method, a touch panel is attached on the surface of liquid crystal display, micro LED display (LED display in which micro LED chips are arrayed in a matrix), organic EL (organic electroluminescent) display, or the like, while in the latter method, a liquid crystal or organic EL display device has a built-in touch sensing function. In recent years, there has been a shift from the on-cell method to the in-cell method.

In touch sensing with a pointer such as a finger or a pen, various types of detection including fingerprint authentication using detection of ridges and valleys of the fingerprint, pen input, feather touch input (light touch input which is close to non-contact), and touch input that imparts a strong pressing force to a substrate are required, in addition to general touch sensing for portable terminal devices. Further, touch sensing capable of detecting a wide range of pressing force to a substrate is also required.

Known touch sensing methods include a self-capacitive touch sensing method and a mutual capacitive touch sensing method. The self-capacitive touch sensing method, which uses an electrode pattern, in which a plurality of electrodes formed of a transparent conductive film such as ITO are arranged and electrically independent from each other, is a method of detecting a capacitance generated in the respective electrodes. The mutual capacitive touch sensing method is a method of detecting a capacitance generated between X direction wiring and Y direction wiring, which are formed by arranging touch sensing wiring (hereinafter, simply referred to as "touch wiring") in the X direction and the Y direction.

Unlike a touch panel externally attached to a display device, the in-cell method has a structure in which touch wiring is formed at a position close to a display functional layer such as a liquid crystal layer. The in-cell method, which does not require an additional member such as a touch panel, can be used to provide thin and light display devices and electronic devices. In particular, in the in-cell method, in which touch wiring is bonded to an array substrate having a TFT (thin film transistor), the touch wiring is formed at a position close to a display functional layer such as a liquid crystal layer. Accordingly, a parasitic capacitance is likely to occur between the wiring such as gate wiring and source wiring, which constitute the thin film transistor for driving the display functional layer, and the touch wiring, and the thin film transistor is likely to be affected by noise.

To provide pen touch input in addition to finger touch input, or fingerprint authentication, a higher-density structure having the touch wiring extending in the X-direction and Y-direction is required. In this case, the number of pixels is required to be similar to that of a high-definition liquid crystal display device, for example 2400×1200 pixels. Further, as described above, for a touch screen capable of touch input with a pen, a structure is required in which the touch wiring extend in the X direction and the Y direction with higher density. This structure can be applied to a narrow frame structure with an increased effective display screen area.

In addition, tablet terminals for pen input touch sensing are commercially available. In such tablet terminals, for example, an electromagnetic induction sensor substrate is disposed in a display device, and pen input to a display surface of the display device is performed by using a stylus pen incorporating a battery. However, the electromagnetic induction type pen input has a problem in that additional members such as the electromagnetic induction sensor substrate and the stylus pen are required.

The capacitive touch sensing has long been studied as a fingerprint authentication technology. PTL 1 discloses a fingerprint input device using MOS-FETs arranged in a matrix. However, PTL 1 does not disclose a touch panel configuration formed on the transparent substrate.

PTL 2 discloses a liquid crystal display device to which a touch sensing technique using a plurality of transistors is applied. As described in paragraphs [0026] to [0030] and FIG. 2 in PTL 2, the sensor circuit 45 includes the transistor M3 and the capacitive element CS1. The electrode ECS overlaps the electrode COM, and the electrode CS1 is composed of the electrode ECS, the electrode COM, and the insulating layer 65. The electrode ECS and the electrode COM are translucent conductive films, and have a complicated configuration. When the electrode ECS and the electrode COM are made of translucent conductive films in the display device driven by liquid crystals, there is another problem. This will be described later.

In PTL 3, as described in claim 3 and paragraphs [0040] to [0043], touch sensing is performed by capacitive coupling between the first line and the second line. Further, as described in paragraph [0066], the first block as a main part of the first line and the second block as a main part of the second line are formed by patterning a transparent conductive layer. As examples of the transparent conductive layer, ITO, IZO, and ITZO are described. In other words, the technique disclosed in PTL 3 is a mutual capacitive touch sensing technique in which a change in capacitance between the first line and the second line is detected. The method disclosed in PTL 3 requires patterning of the first line and the second line, and patterning of the second bridge. This makes the manufacturing steps complicated. Further, since the main parts of the first and second lines are transparent conductive layers having high resistance, touch sensing is performed with a large time constant. This is not desirable, since the response to touch signal is delayed, and a high S/N ratio (ratio of signal to noise) may not be achieved. When the first block and the second block are transparent conductive layers (or translucent conductive films), there is another problem. This will be described later.

In PTL 4, as recited in claim 17, a touch sensing technique is disclosed, in which one of a pair of wirings functions as a detection wiring, and the other functions as a drive wiring.

The disclosure of FIGS. 4, 5, and paragraph [0108] of PTL 4 is a typical wiring example. In other words, PTLs 3 and 4 both disclose mutual capacitive touch sensing techniques. However, PTL 4 does not disclose a conductive pattern having a configuration in which a copper layer or a copper alloy layer is sandwiched between conductive oxide layers. Further, PTL 4 does not disclose a structure using the conductive pattern for a capacitor pattern having one or more openings, nor a structure in which the capacitor pattern is extended to form a gate electrode of the thin film transistor.

PTL 1: JP 3418479 B
PTL 2: JP 2015-215606 A
PTL 3: JP 2013-222202 A
PTL 4: JP 2017-54926 A

SUMMARY OF THE INVENTION

According to an aspect of the present invention, a black matrix substrate includes a transparent substrate having a first surface and a second surface opposite to the first surface, a black dielectric layer formed on the second surface, a first insulating layer formed on the black dielectric layer, a first conductive layer formed on the first insulating layer and including a first conductive pattern that includes a metal layer or an alloy layer sandwiched between conductive oxide layers, a second insulating layer formed on the first conductive pattern, an oxide semiconductor layer formed on the second insulating layer, a second conductive layer formed on the oxide semiconductor layer and the second insulating layer, the second conductive layer including a second conductive pattern that includes a metal layer or an alloy layer sandwiched between conductive oxide layers, a transparent resin layer formed on the second conductive pattern, a light-absorbing layer formed on the transparent resin layer, and a first thin film transistor including a first gate electrode, a first source electrode, a first drain electrode, a first channel layer, and a gate insulating layer. The black dielectric layer includes carbon and covers the first conductive pattern and the second conductive pattern in a plan view perpendicular to the first surface. The light-absorbing layer includes carbon and covers the first conductive pattern and the second conductive pattern in a plan view perpendicular to the second surface. The first gate electrode is a portion of the first conductive pattern, the first source electrode and the first drain electrode are portions of the second conductive pattern, the first channel layer is a portion of the oxide semiconductor layer, and the gate insulating layer is a portion of the second insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

With reference to the drawings, embodiments of the present invention will be described.

In the following description, identical or substantially identical functions and components are indicated by identical reference signs, and the description thereof will be omitted or simplified, or will be given only when necessary. Throughout the drawings, in order to illustrate the components at a recognizable size, the dimensions and proportions of the components are modified as appropriate. Components difficult to illustrate, for example, a configuration of a plurality of layers constituting a channel layer of a semiconductor, a configuration of a plurality of layers constituting a conductive layer, and the like are entirely or partially omitted as necessary.

Further, for ease of understanding of the description of embodiments of the present invention, illustration of electric circuit elements, display functional layer, and the like may be simplified.

In the embodiments described below, only characteristic parts of an electronic device of the present embodiments will be described, and description of parts that are not different from components used in common electronic devices may be omitted.

In the specification, the term "plan view as viewed perpendicular to a first surface" refers to a plan view, in which a black dielectric layer, a conductive pattern, and a light-absorbing layer stacked on a second surface (rear surface) of the transparent substrate, as viewed perpendicular to the first surface by an observer. The term "plan view as viewed perpendicular to a second surface" refers to a plan view, in which a conductive pattern and a black dielectric layer stacked on the second surface of the transparent substrate, as viewed perpendicular to the second surface (a side opposite to that oriented toward the observer). When the term "plan view as viewed perpendicular to the first surface" and the term "plan view as viewed perpendicular to the second surface" are substantially equivalent, they are simply referred to as "plan view."

Further, in the specification, ordinal numerals such as "first" and "second" are given to avoid confusion of components, and do not limit quantity thereof. The first conductive pattern and the second conductive pattern may also be hereinafter simply referred to as a conductive pattern or a conductive layer. In addition, the above conductive layers (conductive patterns) all have a three-layer configuration in which a metal layer or an alloy layer is sandwiched between conductive oxide layers.

In the embodiments of the present invention, a "display functional layer" of a display device may include a plurality of light emitting diode elements called LEDs, a plurality of organic EL (organic electroluminescent) elements called OLEDs, or a liquid crystal layer.

First Embodiment (Circuit Configuration of Black Matrix Substrate)

Figure 1:
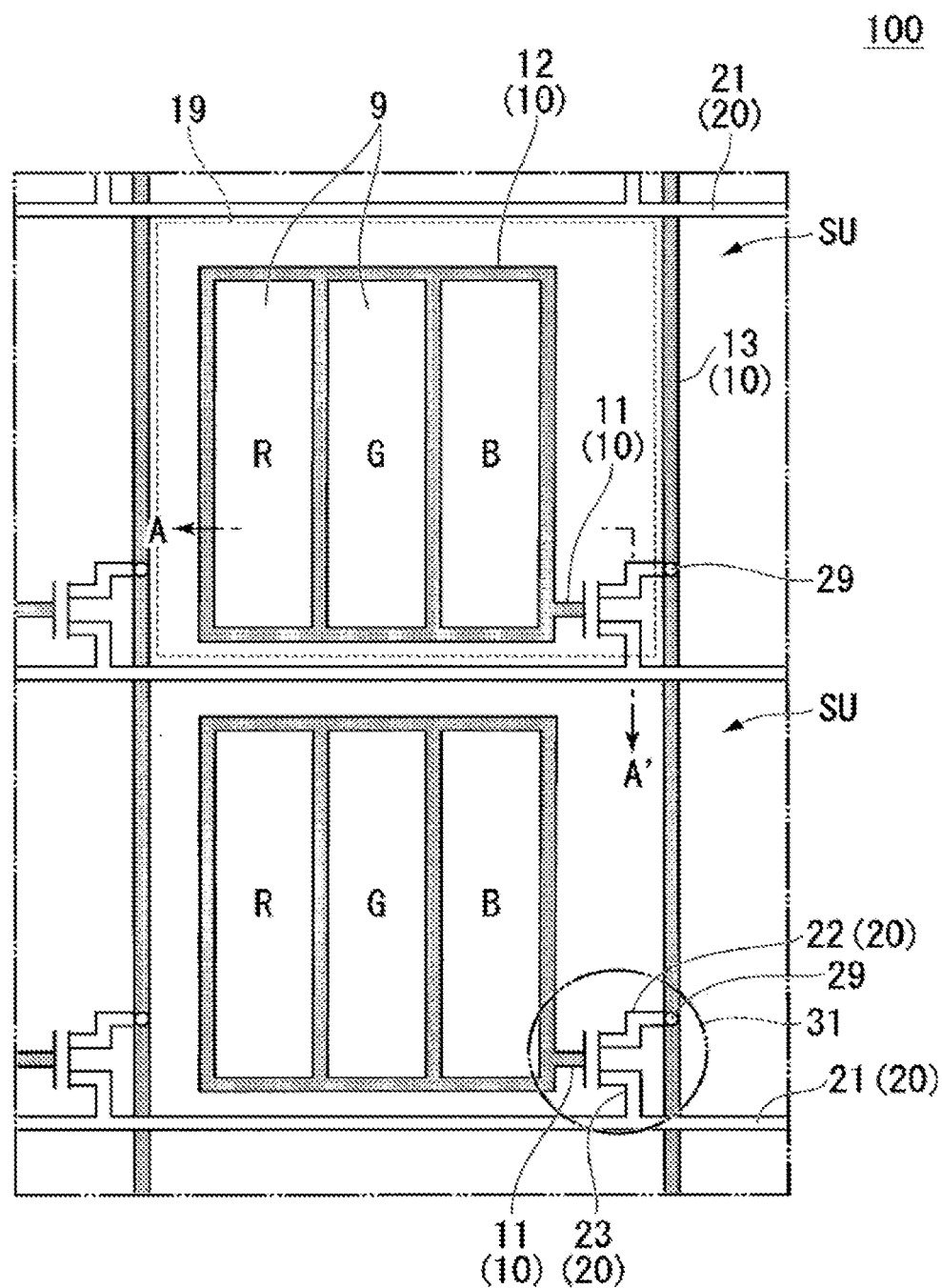
FIG. 1 is a partial enlarged view of a configuration of a black matrix substrate according to a first embodiment of the present invention, showing a circuit diagram of a sensor unit (unit cell) including a capacitor pattern and a thin film transistor (first thin film transistor).

FIG. 1 is a partial enlarged view of a configuration of a black matrix substrate according to a first embodiment of the present invention, showing a circuit diagram of a sensor unit (unit cell) including a capacitor pattern and a thin film transistor (first thin film transistor). In the circuit diagram shown in FIG. 1, for ease of understanding, a configuration of a partitioned region 19 is shown as a minimum element configuration. That is, FIG. 1 illustrates a minimum element configuration in which the partitioned region 19 includes only one first thin film transistor 31.

Further, while FIG. 1 is a circuit diagram, the figure illustrates an actual shape of a capacitor pattern 12 composed of three openings 9, that is, a schematic configuration of the sensor unit for ease of understanding of the following description. The capacitor pattern 12 is disposed in the partitioned region 19 (region) defined by a scanning line and an output line.

(Partitioned Region)

The partitioned region 19 is a region defined by a scanning line 13 that drives a thin film transistor and an output line 21 that receives an output signal from a thin film transistor. Although some of the sensor units provided on the outermost periphery of the display region may not include one of the scanning line 13 and the output line 21 as described later, such a sensor unit is also treated as a "sensor unit" in the embodiments of the present invention. Further, the sensor unit may also be referred to as a "detection unit in touch sensing."

As will be described later, a sensor unit composed of a black dielectric layer, a conductive layer (conductive pattern) in which a metal layer or an alloy layer is sandwiched between conductive oxide layers, a light-absorbing layer, a thin film transistor, one capacitor pattern, and the like is defined as a unit cell. A plurality of unit cells are arranged in a matrix on the black matrix substrate. In the following description, the sensor unit or the unit cell may be used as a technical term. The sensor unit or the unit cell refers to a region where a capacitor is formed, that is, a region defined by a scanning line and an output line.

In plan view, the scanning line extends in a first direction, and the output line extends in a second direction, which is perpendicular to the first direction.

(Sensor Unit)

As shown in FIG. 1, a sensor unit SU includes a first conductive pattern 10, a second conductive pattern 20, and a first thin film transistor 31.

The first thin film transistor 31 includes a first gate electrode 11, a first source electrode 22, a first drain electrode 23, a first channel layer 16 (oxide semiconductor layer, described later), and a gate insulating layer (second insulating layer 48, described later). The first source electrode 22 is connected to the scanning line 13 via a contact hole 29. The first drain electrode 23 is connected to the output line 21.

The first drain electrode 23 is connected to the output line 21. The output line 21, the first source electrode 22, and the first drain electrode 23 constitute the second conductive pattern 20. In other words, the second conductive pattern 20 is formed of the second conductive layer, and the first conductive pattern 10 is formed of the first conductive layer.

The first conductive pattern 10 and the second conductive pattern 20 may also be simply referred to as a conductive pattern. The first conductive layer and the second conductive layer may also be simply referred to as a conductive layer. As will be described later, the conductive layer refers to a configuration in which a metal layer or an alloy layer is sandwiched between conductive oxide layers.

(First Conductive Layer)

The first gate electrode 11, the capacitor pattern 12 (capacitor electrode), and the scanning line 13 constitute the first conductive layer having the first conductive pattern 10. The capacitor pattern 12 includes one or more openings 9 (first openings) in plan view.

The shape of the opening 9 is not limited to a rectangle shown in FIG. 1, but may also be a parallelogram.

The capacitor pattern 12 is connected to the first gate electrode 11. The capacitor pattern 12 supplies a signal to the first thin film transistor 31 in response to a change in capacitance caused by a pointer such as a finger coming into contact with the first surface 1 or approaching the first surface 1. In this sense, the capacitor pattern 12 may also be rephrased as a capacitor electrode.

In FIG. 1, reference signs R, G, and B correspond to a red pixel R, a green pixel G, and a blue pixel B, respectively, of an array substrate facing the black matrix substrate (bonded to the black matrix substrate) when the black matrix substrate is applied to a display device that performs color display. That is, the capacitor pattern 12 has a size corresponding to the size of one or more pixels used for display. For example, for image display using three pixels which are red, green, and blue, the size of the capacitor pattern may be an integral multiple of three. For example, for image display using four pixels which are red, green, blue, and white, the size of the capacitor pattern can be an integral multiple of four. In a fourth embodiment described later, a configuration is illustrated in which color filters including a red pixel, a green pixel, and a blue pixel are disposed at the openings 9 of the black matrix substrate.

(Second Conductive Layer)

The output line 21, the first source electrode 22, and the first drain electrode 23 constitute a second conductive layer having the second conductive pattern 20. Further, roles (functions) of the scanning line and the output line can be exchanged with each other. In addition, roles (functions) of the source electrode and the drain electrode can be exchanged with each other. That is, in FIG. 1, reference sign 13 may indicate the output line, reference sign 21 may indicate the scanning line, reference sign 22 may indicate the first drain electrode, and reference sign 23 may indicate the first source electrode.

(Structures of First Conductive Layer and Second Conductive Layer)

The first conductive layer and the second conductive layer have a configuration in which a metal layer or an alloy layer is sandwiched between conductive oxide layers.

Since the first gate electrode 11, the capacitor pattern 12, and the scanning line 13, which constitute the first conductive layer, and the output line 21, which constitutes the second conductive layer, are made of a metal or an alloy having good conductivity, the capacitance detection responsiveness and the S/N ratio can be improved. Examples of the metal having high conductivity as described above include silver, copper, and aluminum. A silver alloy, a copper alloy, or an aluminum alloy may also be used in consideration of reliability. Since the conductive layer (conductive pattern), in which a metal layer or an alloy layer is sandwiched between conductive oxide layers, is used in the configurations of the capacitor pattern 12, the scanning line 13, and the output line 21, a plurality of advantages described below can be obtained.

First Advantage:

For example, when the conductive layer is formed of wiring (copper alloy wiring) having a single layer of a copper alloy (configuration having no conductive oxide), electrostatic breakdown may occur depending on the magnitude of capacitance of a pointer such as a finger, resulting in chipping or peeling of the copper alloy wiring. Further, silver, copper, or a copper alloy has insufficient adhesion to resin or glass.

On the other hand, according to the present embodiment, the conductive layer has a configuration in which a metal layer or an alloy layer is sandwiched between the conductive oxide layers. The conductive oxide has good adhesion to silver, copper, a copper alloy, and the like, and also good adhesion to resin and glass. Accordingly, the copper alloy wiring is resistant to being chipped or peeled due to electrostatic breakdown.

Second Advantage:

For example, when the conductive layer is formed of silver alloy wiring or copper alloy wiring (configuration having no conductive oxide), silver or copper may diffuse into the resin or glass substrate, resulting in lower reliability. In particular, when the manufacturing steps include processing at a temperature higher than 250° C., copper or a copper alloy is likely to be oxidized.

On the other hand, according to the present embodiment, which uses the conductive layer in which a metal layer or an alloy layer is sandwiched between the conductive oxide layers, the conductive oxide layer prevents diffusion of silver or copper into the glass substrate, which suppresses oxidation of copper.

Third Advantage:

Silver, copper, and a copper alloy are relatively soft metals. Accordingly, a wiring made of silver, copper, or a copper alloy is likely to be damaged when it is electrically mounted on an edge of the touch panel.

On the other hand, according to the present embodiment, which uses the conductive layer in which a metal layer or an alloy layer is sandwiched between the conductive oxide layers, a hard and reliable mounting can be achieved by the conductive oxide layers sandwiching copper, a silver alloy, or a copper alloy since the conductive oxide is one of ceramic materials.

Fourth Advantage:

In the present embodiment, the first source electrode 22 is electrically connected to the scanning line 13 via the contact hole 29. The conductive oxide layer enables good electrical connection in the contact hole 29. As described above, copper oxide is likely to be formed on a surface of copper or a copper alloy. Copper oxide increases the thickness over time, and reduces the stability in electrical mounting. Similarly, oxides and sulfides are likely to be formed on a surface of silver. In a configuration in which copper or a copper alloy is sandwiched between conductive oxide layers, a conductive oxide layer is formed on a surface of the conductive layer (conductive pattern), which enables ohmic contact. It is also effective to apply a conductive layer having a configuration in which a metal layer or an alloy layer is sandwiched between the conductive oxide layers to a configuration of the thin film transistor. In other words, the conductive layer according to the embodiments of the present invention can be applied to a source line, a source electrode, a drain electrode, a gate electrode, a gate line, and a touch sensing wiring of various TFTs (thin film transistor).

(Conductive Metal Oxide Layer)

Materials of the conductive oxide layer may be a mixed oxide containing 50 at % or more of indium oxide. In a method of forming a three-layer structure in which a copper layer or a copper alloy layer is sandwiched between two conductive oxide layers, three layers composed of [mixed oxide layer A/copper alloy layer B/mixed oxide layer C] are first formed on a substrate made of glass or the like. Then, wet etching is performed so that the three layers have the same line width. Alternatively, wet etching may be performed so that the mixed oxide layer A, the copper alloy layer B, and the mixed oxide layer C, which are sequentially formed on a surface of the glass substrate, have the line widths decreasing in this order, satisfying the condition [line width of the mixed oxide layer A>line width of the copper alloy layer B>line width of the mixed oxide layer C].

Typically, an ITO (composite oxide containing indium oxide and tin oxide) has a lower ionization tendency than copper or copper alloys. As a consequence, the copper is selectively etched, and the line widths of the three layers do not satisfy the above width specification. Therefore, in order to adjust the corrosion potential of the composite oxide, soluble oxide, such as zinc oxide, gallium oxide, or antimony oxide, is added to the indium oxide. Thus, the composite oxide having a uniform corrosion potential is obtained.

(Metal Layer, Alloy Layer)

A metal layer or an alloy layer will be specifically described below.

The conductive layer (first conductive layer, second conductive layer) according to the embodiments of the present invention has a three-layer configuration in which a metal layer or an alloy layer is sandwiched between conductive oxide layers as described above. The metal layer or the alloy layer may be made of a metal having good conductivity, such as silver, copper, aluminum or zinc, or an alloy thereof. In the following description, copper and a copper alloy will be described as typical examples, but the basic techniques of the embodiments of the present invention can be applied to metals such as silver and zinc.

An alloy element to be added to the copper may be an alloy element that increases a specific resistance of the copper alloy layer by 1 $\mu\Omega$cm/at % or less. The specific resistance (electrical resistivity) of the copper alloy layer can be in the range of 1.9 $\mu\Omega$cm to 6 $\mu\Omega$cm.

Examples of the additive element (copper alloy element) having low electrical resistivity and only small influence on the electrical resistivity, which are added to a copper alloy, include palladium (Pd), magnesium (mg), beryllium (Be), gold (Au), calcium (Ca), cadmium (Cd), zinc (Zn), and silver (Ag). Adding these elements by 1 at % to pure copper increases electrical resistivity by approximately 1 $\mu\Omega$cm or less. When calcium (Ca), cadmium (Cd), zinc (Zn), or silver (Ag) is added to pure copper, the electrical resistivity increases by 0.4 $\mu\Omega$cm/at % or less. Accordingly, calcium (Ca), cadmium (Cd), zinc (Zn), or silver (Ag) is preferably used as an alloy element. Zinc and calcium are particularly preferable in terms of economy and environmental friendliness. Zinc and calcium can each be added as alloy element to copper at up to 5 at %.

When the copper layer or the copper alloy layer has a thickness of 100 nm or more, or 150 nm or more, the conductive layer hardly transmits visible light. The copper layer or the copper alloy layer constituting the conductive layer according to the present embodiment can obtain sufficient light-shielding properties when it has a thickness in the range, for example, of 100 nm to 500 nm. The copper alloy layer may have a thickness exceeding 500 nm. As will be described later, the material of the conductive layer is applicable to the wiring and electrodes provided on the array substrate described later. In the present embodiment, a structure of the wiring electrically connected to the active element (thin film transistor) such as gate electrode and gate wiring may be a laminate structure in which a copper alloy layer is sandwiched between conductive metal oxide layers. In other words, the conductive layer (conductive pattern) according to the embodiments of the present invention can have a laminate structure in which a copper alloy layer is sandwiched between conductive metal oxide layers.

(Cross-Sectional Structure of Black Matrix Substrate)

Figure 2:
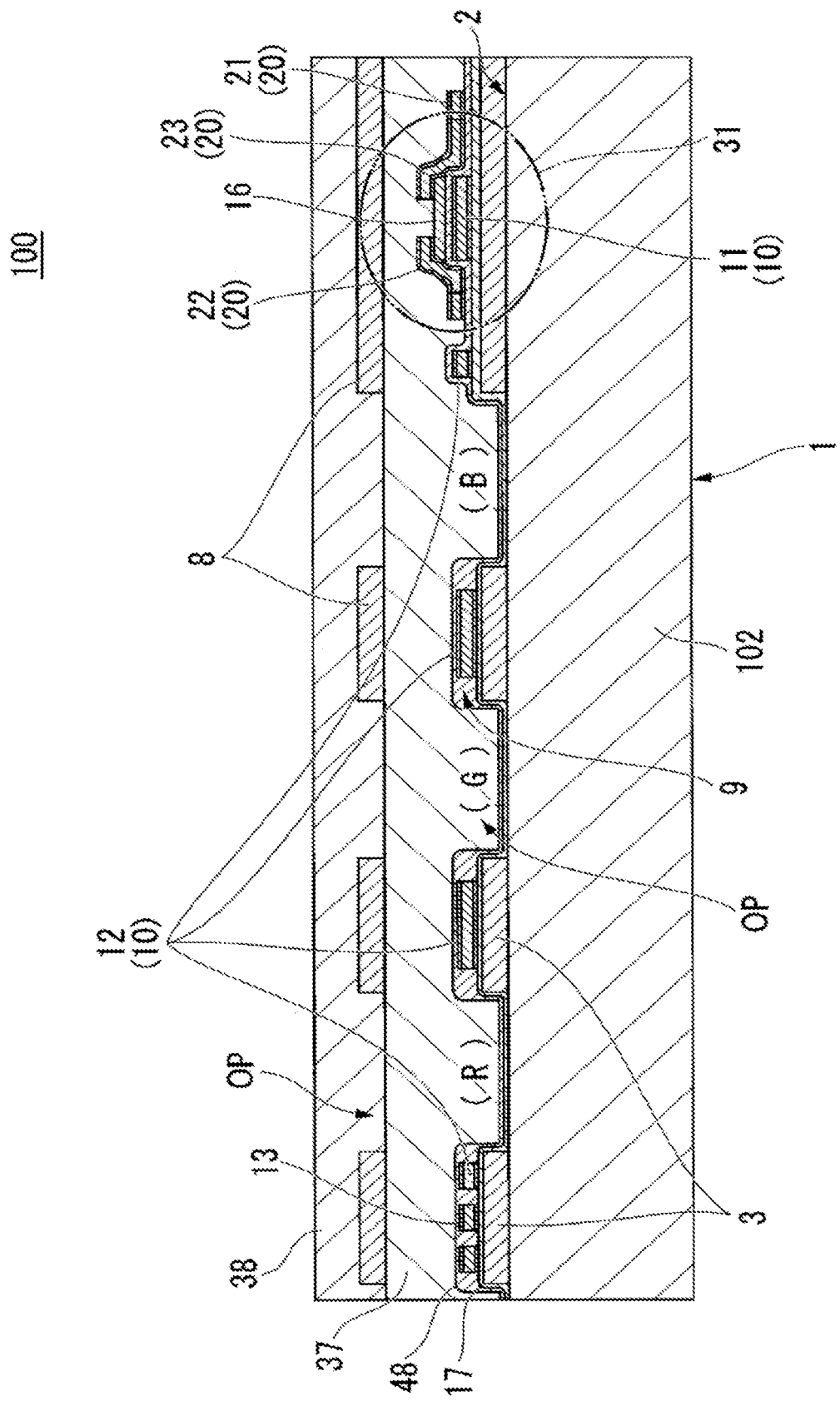
FIG. 2 is a cross-sectional view of a sensor unit taken along the line A-A' of FIG. 1.

FIG. 2 is a cross-sectional view of the sensor unit SU (unit cell) taken along the line A-A' of FIG. 1. In other words, FIG. 2 is a cross-sectional view of a black matrix substrate 100 according to the embodiments of the present invention.

The black matrix substrate 100 includes a transparent substrate 102 (first substrate) having the first surface 1 and a second surface 2.

Specific substrate materials of the transparent substrate 102 that can be applied to the black matrix substrate 100 are not particularly limited as long as they are transparent in the visible region. Various transparent substrates, for example, sapphire substrates, substrates made of aluminosilicate glass or the like, acrylic substrates, and resin substrates laminated with a polyester film, a polyimide film, a TAC film used for polarizing plates, vinyl chloride used for IC cards IC, and the like can be used. However, when the black matrix substrate 100 is used for a device that performs fingerprint authentication, the substrate preferably has a surface which is rigid, and accurately smooth and flat as with a glass substrate.

A black dielectric layer 3 and a first insulating layer 17 are stacked in this order on the second surface 2 of the transparent substrate 102. That is, the black dielectric layer 3 is provided on the second surface 2, and the first insulating layer 17 is provided on the black dielectric layer 3 to cover an exposed surface (surface) of the second surface 2 and a surface of the black dielectric layer 3. Further, a first conductive pattern 10 is provided on the first insulating layer 17.

The first gate electrode 11, the capacitor pattern 12, and the scanning line 13 are disposed on the black dielectric layer 3 to form the first conductive pattern 10. The second insulating layer 48 is disposed to cover the first conductive pattern 10 (including the first gate electrode 11, the capacitor pattern 12, and the scanning line 13) and an exposed surface (surface) of the first insulating layer 17. That is, the second insulating layer 48 is provided on the first conductive pattern 10.

A first transparent resin layer 37 (transparent resin layer) is disposed on the second insulating layer 48. That is, the transparent resin layer is provided on the second conductive pattern 20 (second conductive layer). A light-absorbing layer 8, and a second transparent resin layer 38 (resin layer, adhesive layer) are stacked on the first transparent resin layer 37. The second transparent resin layer 38 covers an exposed surface (surface) of the first transparent resin layer 37 and the light-absorbing layer 8.

(First Insulating Layer)

A material for the first insulating layer 17 may be silicon dioxide, silicon nitride, transparent inorganic oxide or transparent nitride having a high dielectric constant. A material for the first transparent resin layer 37 and the second transparent resin layer 38 may be an acrylic resin, a polyimide resin, a benzocyclobutene resin, a polyamide resin, or the like. A low dielectric material (low-k material) may also be used. A conductor layer having the same pattern as the first transparent resin layer 37 in plan view may be disposed at the interface between the first transparent resin layer 37 and the light-absorbing layer 8. The conductor layer may be grounded as necessary to form an auxiliary capacitance between the conductor layer and the capacitor pattern 12.

The first insulating layer 17 may have a film thickness of, for example, in the range of 1 nm to 1000 nm. A material of the first insulating layer 17 may be an oxide layer containing at least one of silicon dioxide, silicon oxynitride, cerium oxide, and titanium oxide. The first insulating layer 17 may be made of a material having a high relative dielectric constant at the interface between the capacitor pattern 12 and the first insulating layer 17.

Examples of the material for forming the first insulating layer 17 include, but are not limited to, silicon oxide, silicon oxynitride, and silicon nitride. The thickness of the first insulating layer 17 is not specifically limited, and may be, for example, in the range of 1 nm to 1000 nm.

(Black Dielectric Layer)

The black dielectric layer 3 according to the embodiments of the present invention includes carbon. Specifically, the black dielectric layer 3 is composed of a dispersion in which carbon is dispersed in a resin, or a dispersion in which a dielectric such as fine particles of metal oxide or the like is further dispersed in the carbon. That is, the black dielectric layer 3 may be made of a resin dispersion containing carbon and fine particles of a dielectric composed of at least metal oxide. The black dielectric layer 3 has a configuration that covers the first conductive pattern 10 and the second conductive pattern 20 in plan view. In the following description, the fine particles may also be simply referred to as powder.

Electrical characteristics of the black dielectric layer 3 can be adjusted by adjusting dispersion state, concentration, composition, film thickness, and the like of the carbon in the black dielectric layer 3. For example, a high relative dielectric constant in the range of 10 to 700 can be achieved. The relative dielectric constant of the black dielectric layer 3 can be 150 or more by adjusting the dispersion state of carbon, or by adding fine particles of ferroelectric material or fine particles of paraelectric material to the black dielectric layer 3.

However, when the black matrix substrate according to the present embodiment is applied to electronic devices having a problem that dielectric loss (tan δ) of the black dielectric layer 3 leads to an increase in power consumption (for example, mobile devices), the relative dielectric constant of the black dielectric layer 3 can be reduced to a range of 15 to 100.

The black matrix substrate 100 according to the embodiments of the present invention has a configuration in which the black dielectric layer 3 is interposed between the second surface 2 of the transparent substrate 102 and the capacitor pattern 12. The material for forming the black dielectric layer 3 according to the embodiments of the present invention may be a dispersion in which carbon as a black pigment is dispersed in a resin such as acrylic, epoxy, or polyimide. Further, carbon nanotubes, carbon nanohorns, carbon nanobrushes or the like may be mixed and dispersed in a resin. Alternatively, a configuration of the black dielectric layer 3 may be partially replaced with carbon so that carbon nanotubes are dispersed in the resin. In the following description, the black dielectric layer 3 may also be simply referred to as a black dielectric.

In order to adjust a dispersion state of carbon, a relative dielectric constant, and the like in the black dielectric layer 3 according to the embodiments of the present invention, an extender pigment such as calcium oxide, calcium carbonate, barium sulfate, silicon dioxide, kaolin, or clay, in addition to carbon, can be added to the black dielectric layer 3. Alternatively, in addition to carbon, a resin dispersion to which powder of dielectric having a high dielectric constant, such as titanium oxide, barium titanate, titanium black, barium zirconate, magnesium titanate, or calcium sulfate, is added can be used.

Further, in addition to carbon, a resin dispersion to which a powder of a dielectric to which any one of titanium oxide, titanium nitride, and titanium oxynitride is added can be used.

For the above dielectric, a paraelectric material is preferably adopted in order to improve a dispersion state of carbon in the black dielectric layer 3 and prevent dielectric loss from increasing. A paraelectric material is a dielectric having no electrical polarization when no electric field is applied and having a small dielectric loss. A paraelectric material made of metal oxide such as forsterite ($MgSiO_2$), aluminum oxide ($Al_2O_3$), or titanium oxide ($TiO_2$) can be added to the above black dielectric.

Although the black dielectric in which a ferroelectric material is added and dispersed in a resin has a high dielectric constant, the power consumption increases when touch detection is performed in touch driving. The black dielectric in which a paraelectric material is added and dispersed in a resin can increase the degree of change in capacitance (difference between the reset capacitance and the touch capacitance), and reduce power consumption. Further, in the embodiments of the present invention, a metal oxide of paraelectric material is defined as metal oxide or power of metal oxide having a relative dielectric constant of 110 or less and a dielectric loss in the range of 0.00001 to 0.1. The frequency in measurement of these electrical characteristics is a touch sensing frequency described below, which is measured at room temperature of 20° C.

The black dielectric layer 3 according to the embodiments of the present invention is composed of a dispersion in which fine particles of metal oxide such as carbon or titanium oxide are dispersed in a resin, having a relative dielectric constant in the range of 10 to 700, or in the range of 15 to 100. A dispersion (solid) of the black dielectric layer 3 may have a dielectric loss (tan δ), for example, in the range of 0.005 to 0.2 at the touch sensing frequency in the range of 200 Hz to 500 kHz. Further, the value of dielectric loss is preferably 0.08 or less. The resistivity of the black dielectric layer 3 may be adjusted so that reset is completed when the capacitor pattern 12 is reset as described below. In other words, for setting the reset potential such as the ground, for example, the resistivity of the black dielectric can be set to a value less than $1 \times 10^{13}$ Ωcm to thereby shorten the relaxation time (or time constant).

Further, in order to maintain touch capacitance, the black dielectric may have a resistivity of, for example, $1 \times 10^{13}$ Ωcm or more.

However, when the resistivity of the black dielectric is $1 \times 10^{14}$ Ωcm or more, the relaxation time described above may be affected. For this reason, it is less advantageous for the resistivity of the black dielectric to be $1 \times 10^{14}$ Ωcm or more. The electrical characteristics of the black dielectric can be various adjusted depending on the touch sensing as described above. Further, the fine particles described above have a mean particle size in the range of 0.02 to 2 μm.

(Light-Absorbing Layer)

The light-absorbing layer 8 according to the embodiments of the present invention may have an optical density, for example, in the range of 1 to 4. For example, a dispersion in which a black pigment such as carbon is dispersed in a transparent resin such as an acrylic resin may be used as the light-absorbing layer 8. The light-absorbing layer may have electrical characteristics such as a dielectric constant which are the same as or different from those of the black dielectric layer 3. The light-absorbing layer 8 is formed to cover the first conductive pattern 10 and the second conductive pattern 20. In the configuration in which the black matrix substrate 100 is applied to the display device having the array substrate, the light-absorbing layer 8 shown in FIG. 2 is provided to prevent light reflected by the conductive pattern, which is a metal layer, from being incident on the light emitting elements such as a channel layer and a diode of the thin film transistor disposed on the array substrate.

Since the channel layer and the light emitting element are formed of a semiconductor that senses light, the light-absorbing layer 8 is provided to prevent erroneous operations of the channel layer and the light emitting element. The light-absorbing layer 8 contains a light absorber such as carbon or organic pigment. In order to reduce the parasitic capacitance, the configuration of the light-absorbing layer preferably does not include a ferroelectric material.

As shown in FIG. 2, the black dielectric layer 3 and the light-absorbing layer 8 have an opening pattern which includes a plurality of openings OP (second openings). The opening OP has a shape similar to the opening 9. That is, in the present embodiment, the opening OP has a rectangular shape as with the opening 9. When the opening 9 has a parallelogram shape, the opening OP also has a parallelogram shape. The center position of the opening OP overlaps the center position of the opening 9.

(First Thin Film Transistor)

The first thin film transistor 31 is formed on the first insulating layer 17 together with the first gate electrode 11 (see FIG. 1). On the first gate electrode 11 (first conductive pattern 10), the second insulating layer 48 that functions as a gate insulating layer is disposed.

On the second insulating layer 48, the first channel layer 16, the first source electrode 22 (second conductive pattern 20), and the first drain electrode 23 (second conductive pattern 20) are disposed. The first source electrode 22 and the first drain electrode 23 are formed not only on the second insulating layer 48, but also on the first channel layer 16. Specifically, the first source electrode 22 and the first drain electrode 23 are formed to cover portions located on both sides of the first channel layer 16. In the example shown in FIG. 2, the first source electrode 22 covers the left end of the first channel layer 16, and the first drain electrode 23 covers the right end of the first channel layer 16. The first channel layer 16 is formed of an oxide semiconductor.

Although the first thin film transistor 31 shown in FIG. 2 has a bottom gate structure, it may also have a top gate structure. A first thin film transistor having a top gate structure can be formed by modifying the order of forming the first conductive pattern 10 and the second conductive pattern 20 in production of the first thin film transistor 31.

(First Channel Layer)

Two or more oxide semiconductors selected from the group consisting of indium oxide, zinc oxide, gallium oxide, silicon oxide, antimony oxide, bismuth oxide, cerium oxide, and tin oxide can be applied to the first channel layer 16 constituting the oxide semiconductor layer. For example, the oxide semiconductor layer may include indium oxide and at least one of antimony oxide and bismuth oxide. Further, the oxide semiconductor layer may include at least one of cerium oxide and tin oxide.

The oxide semiconductor obtained by adding at least one of antimony oxide and bismuth oxide to indium oxide is advantageous in that it can be crystallized by low temperature annealing at 340° C. or less. Heat processing at a temperature higher than 350° C. may cause a problem that the copper contained in the above conductive layer (conductive pattern) is diffused. Diffusion of copper increases the resistance of the copper wiring and impairs the characteristics of the thin film transistor. For this reason, an oxide semiconductor that crystallizes by annealing at a temperature of 350° C. or less is preferably used.

The first thin film transistor 31 uses an oxide semiconductor that can be formed by heating the first channel layer 16 at low temperature. Therefore, a resin substrate having poor heat resistance as described above can be applied to the transparent substrate 102. On the other hand, when the first channel layer 16 is formed of a polysilicon semiconductor, it is difficult to use a resin substrate since the production of the semiconductor involve laser annealing at approximately 600° C.

In general, a known structure of the thin film transistor includes a channel layer formed of an amorphous silicon semiconductor or a polysilicon semiconductor. The structure using an amorphous silicon semiconductor has low electron mobility, which is insufficient for a semiconductor for a touch sensor. The structure using a polysilicon semiconductor has high electron mobility. However, it leads to a large transistor leakage current, which is disadvantageous in that a capacitance in touch sensing is not likely to be maintained. In particular, both the amorphous silicon semiconductor and the polysilicon semiconductor have low electrical resistance, which may result in damage to the transistor depending on the degree of change in capacitance in touch sensing.

On the other hand, the oxide semiconductor according to the present embodiment has an electrical resistance which is 100 or more times higher than silicon-based semiconductors, and has higher electron mobility. The oxide semiconductor is preferred as the channel layer of the thin film transistor for driving the touch sensor.

(Planar Structure of Black Matrix Substrate)

Figure 3:
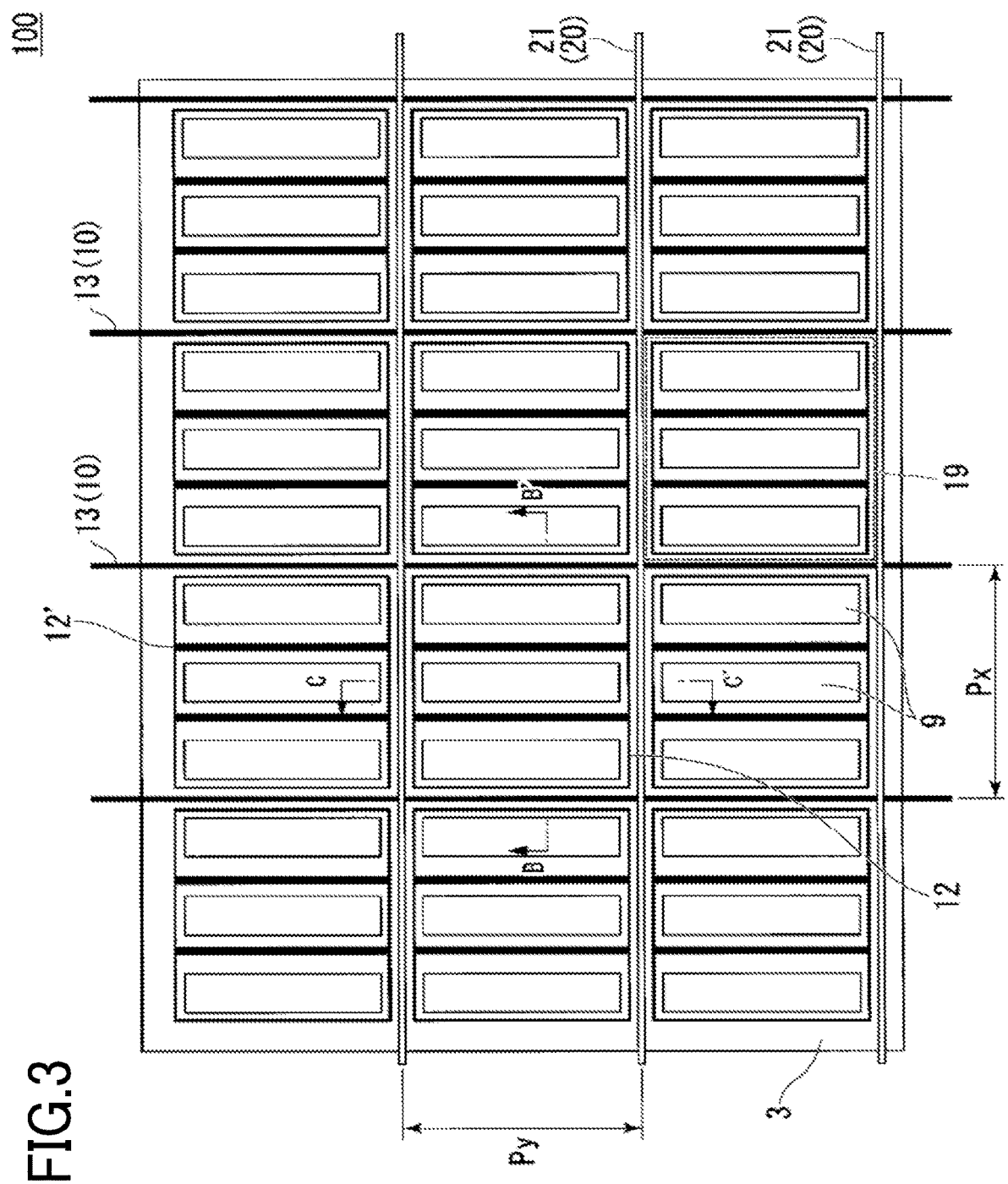
FIG. 3 is a partial enlarged view of a configuration of a black matrix substrate according to the first embodiment of the present invention, showing a plan view of an arrangement of a first conductive pattern of a first conductive layer and a second conductive pattern of a second conductive layer disposed on a black dielectric layer.

FIG. 3 is a partial enlarged view of a configuration of a black matrix substrate 100, showing a plan view of the capacitor pattern 12 and the scanning line 13 constituting the first conductive pattern 10 stacked on the black dielectric layer 3, and the output line 21 constituting the second conductive pattern. FIG. 3 is a plan view as viewed perpendicular to the second surface 2 of the transparent substrate 102, and the light-absorbing layer 8 and the first thin film transistor 31 are not shown in the figure.

A plurality of openings 9 shown in FIG. 3 correspond to a light emission portion of the display device to which the black matrix substrate 100 is applied. Specifically, in the display device formed by bonding the black matrix substrate 100 according to the embodiments of the present invention to the array substrate on which an active element such as TFT (thin film transistor) with a display functional layer therebetween, the plurality of openings 9 correspond to a light emission portion.

The capacitor pattern 12 is formed in the partitioned region 19 defined by the scanning line 13 and the output line 21. Further, the capacitor pattern 12' located on the outermost periphery of the display effective region in the display device may not be completely defined by the scanning line 13 and the output line 21.

Figure 4:
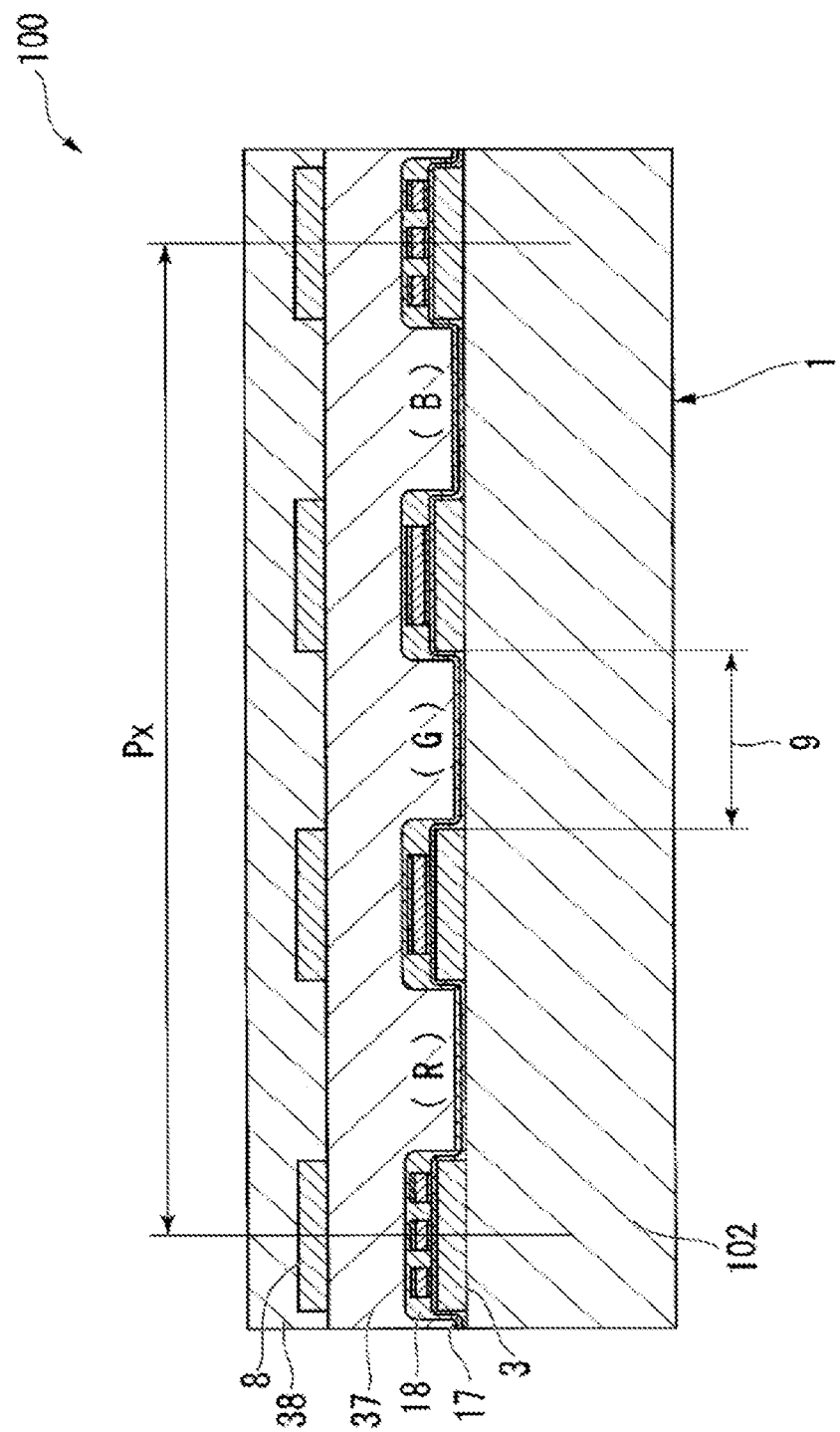
FIG. 4 is a cross-sectional view of a sensor unit taken along the line B-B' of FIG. 3.
Figure 5:
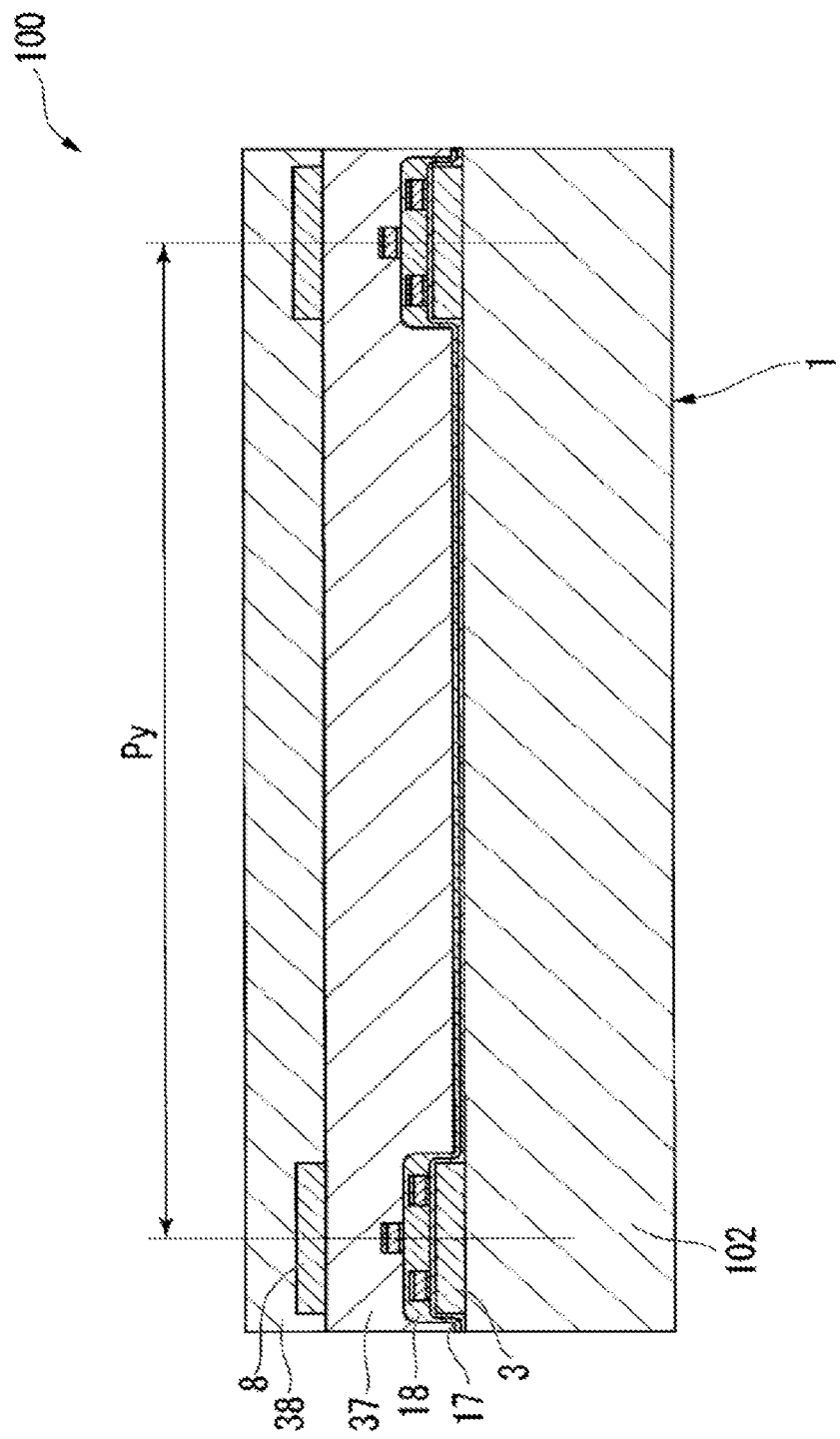
FIG. 5 is a cross-sectional view of a sensor unit taken along the line C-C' of FIG. 3.

FIG. 4 is a cross-sectional view of the sensor unit SU taken along the line B-B' of FIG. 3. FIG. 5 is a cross-sectional view of the sensor unit SU taken along the line C-C' of FIG. 3.

FIGS. 4 and 5 each illustrate one display unit having a width Px and a length Py. In FIG. 4, for example, the display unit includes three openings 9.

As described above, the number of openings 9 included in the capacitor pattern 12 can be, for example, a multiple of 3 or 4. Further, the number of openings 9 may be one or more, and as described later in a modified example, two or more openings 9 may be provided in one partitioned region 19. Since the capacitance of the capacitor pattern 12 is proportional to the area of the capacitor pattern 12, the number of openings 9 can be two or more, or a multiple of 3 or 4.

Usually, for color display of the display device, each display unit is typically composed of 3 RGB pixels (red pixel, green pixel, and blue pixel), or 4 RGBW pixels (red pixel, green pixel, blue pixel, and white pixel). Therefore, setting the number of openings 9 to a multiple of 3 or 4 is convenient for the display unit and the capacitor pattern 12. Alternatively, as described later, the number of openings 9 may be at least one, or at least two, depending on the need of reducing the parasitic capacitance between the scanning line 13 provided for touch sensing and the capacitor pattern 12 (in other words, the need of adjusting the wire-to-wire distance).

Further, the black matrix substrate 100 according to the embodiments of the present invention can provide a color filter substrate by adding color filters such as the red pixel R, green pixel G, and blue pixel B to the plurality of openings 9.

Further, the black matrix substrate 100 can also be used as a touch panel by stacking a protective glass (cover glass) on the black matrix substrate 100 shown in FIG. 4 with the second transparent resin layer 38 (adhesive layer) therebetween.

Further, it is also possible to apply technical means for laminating the entire capacitor pattern 12 with a transparent conductive oxide such as ITO as a transparent electrode. However, this causes an increase in manufacturing cost since the indium contained in ITO is expensive, and additional steps are required for forming an ITO film and patterning the ITO film.

In general, a glass or resin substrate as a support member that supports a transparent electrode such as ITO typically has a relative dielectric constant in the range of approximately 3 to 6. For example, the electrode ECS shown in FIG. 2 of PTL 2 (translucent conductive film) is in contact with the substrate 62 made of glass or resin as described in paragraph [0054]. When a transparent electrode such as ITO is used as a capacitor electrode (capacitor pattern) which is a capacitance detection element, a substrate having a high dielectric constant is preferably used as a substrate provided near the transparent electrode. A glass or resin, which has a low relative dielectric constant, is not a preferable material. In addition, an increase in cost due to manufacturing of the transparent electrode such as ITO is not advantageous. Further, ITO has a resistivity of approximately $2 \times 10^{-4}$ Ωcm.

On the other hand, copper, which is a metal, has a resistivity of $1.6 \times 10^{-6}$ Ωcm, for example, which is 100 times better than the conductivity of ITO. Accordingly, the capacitor electrode (capacitor pattern) which is a capacitance detection element, the scanning line, and the output line are preferably made of metals such as silver, copper, aluminum, and zinc, or alloys containing these materials.

Figure 6:
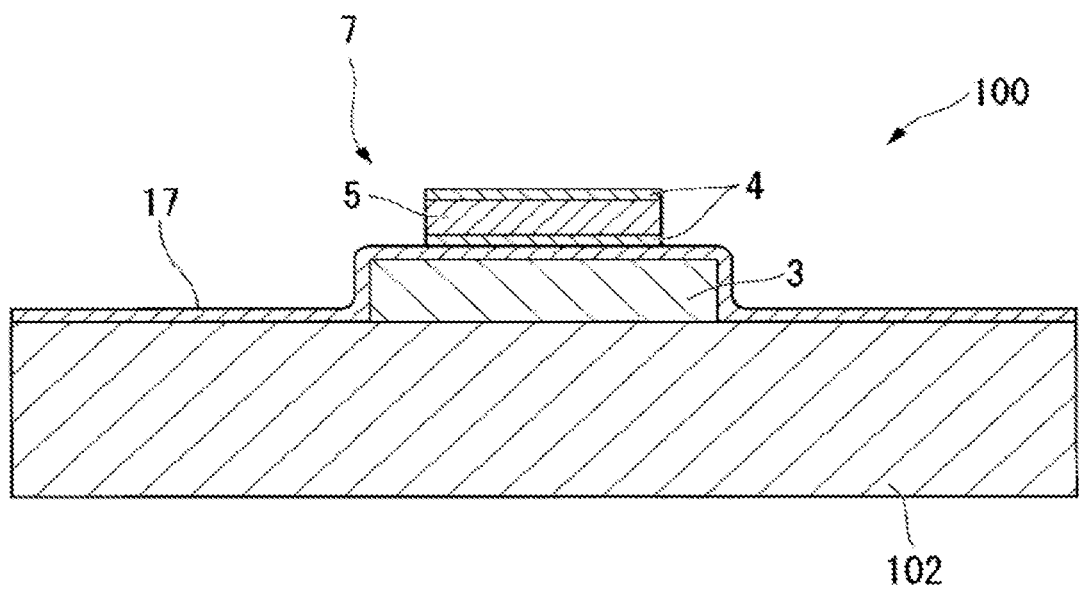
FIG. 6 is a partial enlarged view of a black matrix substrate according to the first embodiment of the present invention, showing a cross-sectional view of a structure of a conductive layer disposed on a first insulating layer on a black dielectric layer.

With reference to FIG. 6, a configuration of a conductive layer 7 (first conductive layer) according to the embodiments of the present invention will be described.

FIG. 6 is a partial enlarged view of the black matrix substrate 100, showing a partial cross-sectional view of a structure in which the black dielectric layer 3, the first insulating layer 17, and the conductive layer 7 are stacked in this order on the transparent substrate 102. The conductive layer 7 has a three-layer configuration in which a metal layer 5 is sandwiched between conductive oxide layers 4. The metal layer 5 shown in FIG. 6 may also be an alloy layer. As described above, the metal layer 5 and the alloy layer may be a copper layer or a copper alloy layer. Two layers located on the upper and lower sides of the conductive oxide layer 4 may have different thicknesses.

Further, the configuration of the conductive layer 7 can be applied to the second conductive layer.

(Touch Detection Process)

Figure 7:
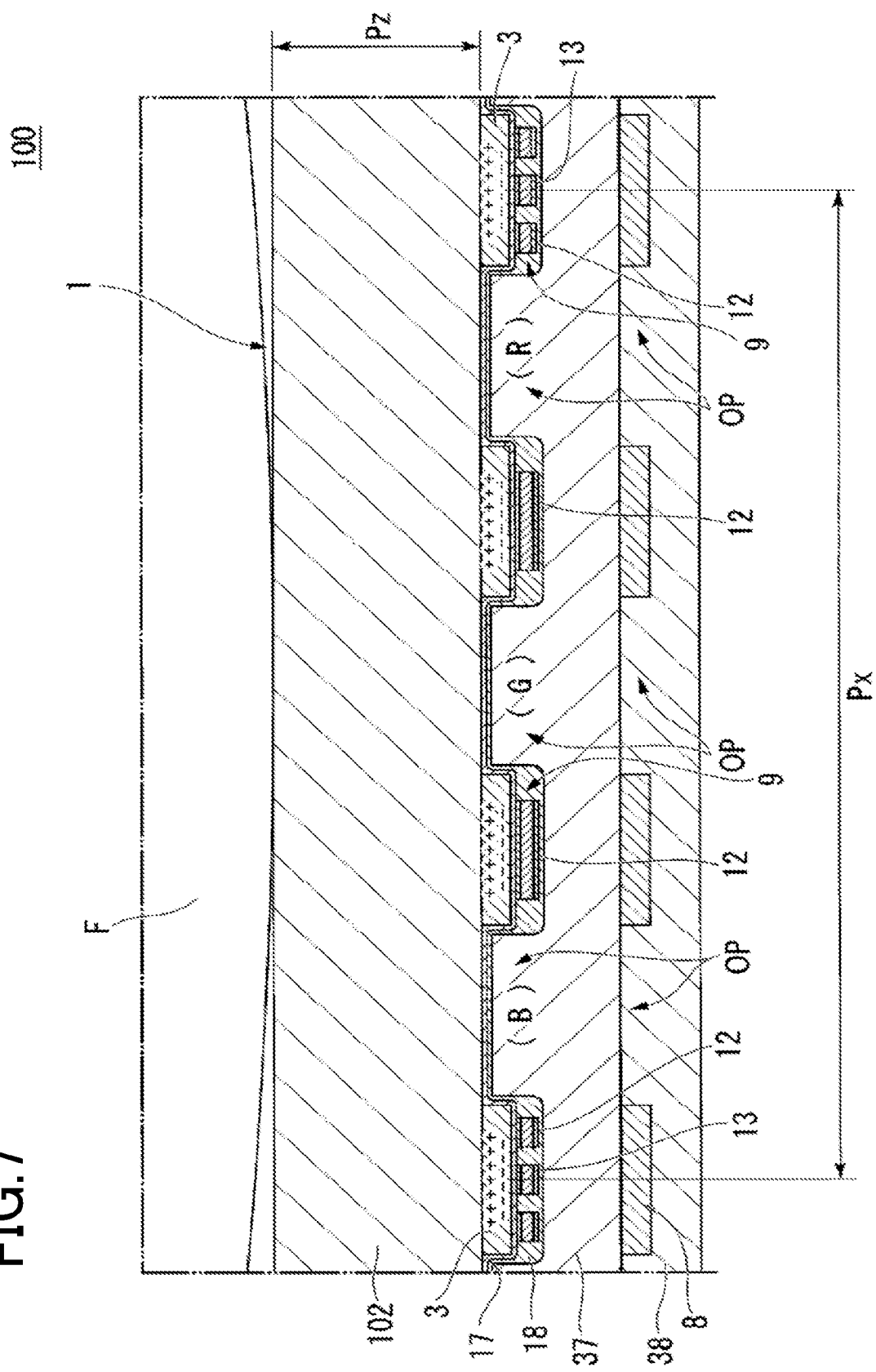
FIG. 7 is a partial enlarged view showing a configuration of a black matrix substrate according to the first embodiment of the present invention, showing a cross-sectional view of a state in which a pointer such as a finger touches a first surface of a black matrix substrate.

FIG. 7 is a partial enlarged view showing a configuration of the black matrix substrate 100, showing a cross-sectional view of a state in which a pointer such as a finger F touches the first surface 1 of the black matrix substrate 100. Referring to FIGS. 1 to 7, the touch detection process will now be described.

First, in the black matrix substrate 100 shown in FIG. 7, when a pointer such as the finger F touches or approaches the first surface 1, the capacitor pattern 12 detects a change in capacitance together with the black dielectric layer 3. The capacitor pattern 12 transmits a touch detection signal to the output line 21 via the first thin film transistor 31. Specifically, the change in capacitance detected by the capacitor pattern 12 (the amount of change in capacitance, the amount of change in electrical potential) is inputted to the first gate electrode 11 of the first thin film transistor 31. The scanning line 13 (the scanning line can be rephrased as a power supply line) transmits a selection signal to the first thin film transistor 31 in the sensor unit SU. The change in capacitance inputted to the first gate electrode 11 is amplified by the first thin film transistor 31, and outputted to the output line 21. Accordingly, the control unit (not shown) connected to the output line 21 detects a touch detection signal to perform touch sensing.

In general, a fingerprint of a finger has a density of approximately 3 lines/mm. For example, a touch panel with a resolution of approximately 10 lines/mm to 100 lines/mm can perform fingerprint authentication. The black matrix substrate 100 according to the present embodiment may have a resolution of 100 lines/mm or more. In the case of pen input, the resolution may be tens of microns corresponding to a pen tip. When the black matrix substrate 100 according to the present embodiment is applied to smartphones, tablets, and the like corresponding to the pixel resolution higher than 400 ppi, a touch resolution higher than 100 lines/mm can be achieved.

For example, as shown in FIGS. 3 and 4, when each of the red pixel R, green pixel G, and blue pixel B has a pixel pitch of 15 μm, the width Px of the capacitor pattern 12 corresponding to these three pixels is 45 μm, which is equivalent to the pitches of three pixels. When the touch sensor has a unit cell width (which is synonymous with a pitch of the unit cell or a size of the display unit) of 45 μm, fingerprint authentication or pen input can be performed. Since the pitch of the ridges and valleys of a fingerprint is approximately 3 lines/mm, the capacitor pattern 12 may have a resolution of, for example, in the range of approximately 10 lines/mm to 100/mm. With this resolution, fingerprint authentication can be performed.

As shown in FIG. 7, as a pointer such as the finger F touches or approaches the first surface 1, the black dielectric layer 3 stores electrical charge, and functions as an electrostatic capacitor (capacitive) element. When the pointer is a pen tip, a change in capacitance occurs in a region of the black dielectric layer 3 having a similar size to the area of the pen tip. When the finger F presses the first surface 1 with a strong pressure, a change in capacitance occurs in the number of regions of the black dielectric layers 3 corresponding to the contact surface of the finger F. The fingerprint pattern of the finger F is two-dimensionally detected according to the ridges and valleys of the fingerprint.

A distance Pz from the black dielectric layer 3 to the finger F shown in FIG. 7 may be practically in the range of approximately 0.1 mm to 1.5 mm. The distance Pz may include, for example, the thickness of a protective cover glass, and the thickness of a polarizing plate or a phase difference plate. According to the configuration of the embodiments of the present invention including the black dielectric layer 3 having a high relative dielectric constant and the metal layer 5 (or alloy layer) having a high conductivity, fingerprint authentication can be performed even when the transparent substrate 102 has a thickness larger than 0.4 mm. The most typical material of the metal layer 5 (or alloy layer) is copper or a copper alloy.

Modification of First Embodiment

Next, modified examples 1 to 4 of the above first embodiment will be described.

In the modified examples described below, the same members as those of the first embodiment will be referred to by the same reference signs and the description thereof will be omitted or simplified.

Modified Example 1

Figure 8:
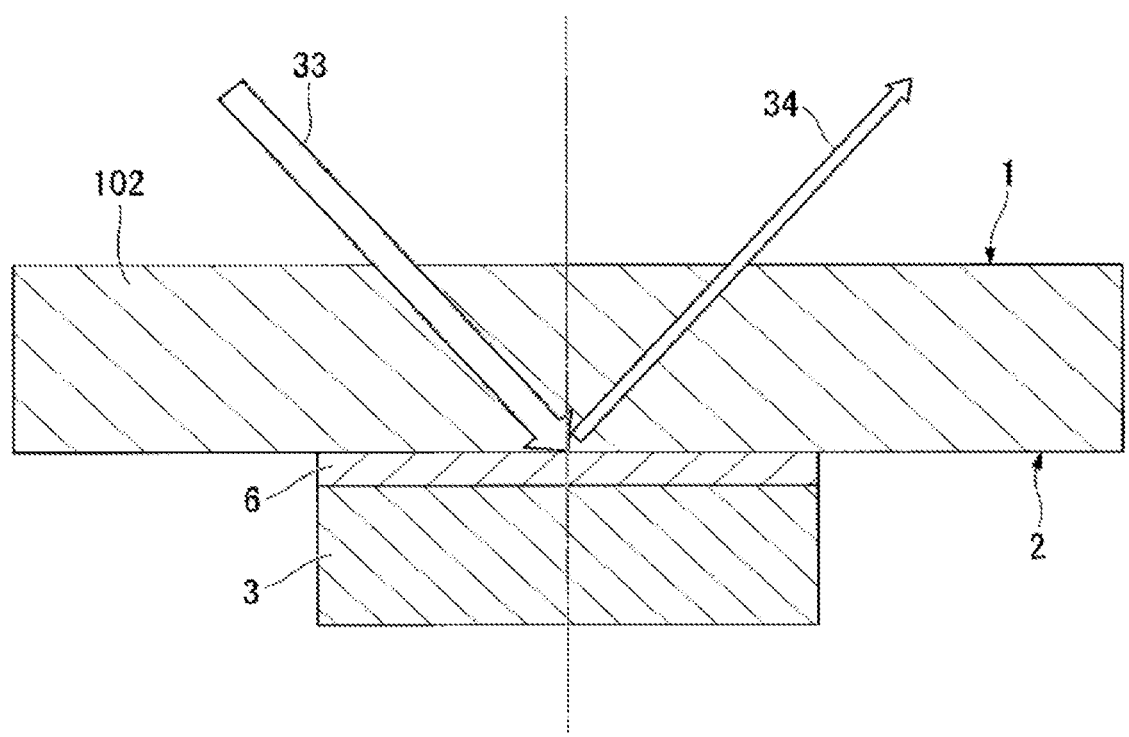
FIG. 8 is a cross-sectional view of a black matrix substrate according to the first embodiment of the present invention, showing how visible light is reflected when a resin dispersion layer having a different carbon concentration is interposed between a second surface and a black dielectric layer.

FIG. 8 is a cross-sectional view of the black dielectric layer 3 constituting the black matrix substrate according to a modified example of the first embodiment, showing how visible light is reflected when a resin dispersion layer having a different carbon concentration is interposed between the second surface 2 and the black dielectric layer 3.

In the modified example 1, the black dielectric layer is composed of two resin dispersions (black dielectric layer 3, low-concentration carbon layer 6) having different carbon concentrations. At least one of two resin dispersions contains a dielectric made of metal oxide.

The carbon concentrations of the low-concentration carbon layer 6 and the black dielectric layer 3 may not be necessarily strictly specified. The low-concentration carbon layer 6 has an effective optical density, for example, in the range of 0.05 to 0.4. The film thickness of the low-concentration carbon layer 6 may be set in the range of 0.1 μm to 0.7 μm. The black dielectric layer 3 has an effective optical density, for example, in the range of 0.5 or more and less than 3. The film thickness of the black dielectric layer 3 may be set in the range of 0.5 μm to 2 μm. Although the optical density of the black dielectric layer 3 may be set to a value larger than 3, there is no technical advantage in setting the optical density of the black dielectric layer 3 in contact with a metal layer or an alloy layer to a value larger than 3. Although the film thickness of the low-concentration carbon layer 6 may be set to a value larger than 0.8 μm, there is no technical advantage in increasing the film thickness of the low-concentration carbon layer 6.

By providing the low-concentration carbon layer 6 shown in FIG. 8, the reflectance of visible light between the second surface 2 and the black dielectric layer 3 as viewed perpendicular to the first surface 1 (in a view direction) can be 0.4% or less. This low reflectance of 0.4% or less is a substantially flat reflectance in the light wavelength in the range of 400 nm to 700 nm, and is different from that of a low reflection film of a typical optical multilayer. In a low reflection film of an optical multilayer having a configuration in which $SiO_2/TiO_2$ or the like is stacked, it is difficult to obtain a low reflectance in a wide wavelength range.

Here, the reflectance is a ratio of reflected light 34 to incident light 33 entering from the outside. The reflected light 34 is light obtained from the incident light 33 reflecting at the interface between the low-concentration carbon layer 6 and the second surface 2. The reflectance can be measured by using a microspectroscope. Further, a chromaticity observed between the black dielectric layer 3 and the second surface 2, and a chromaticity observed between the low-concentration carbon layer 6 and the black dielectric layer 3 (that is, a chromaticity observed at the second surface 2) is a small value of ±2.0 or less, which is a colorless neutral color. Further, the reflectance at the interface between a single layer of the black dielectric layer 3 and the second surface can be set to approximately 3%.

The black dielectric layer 3 can adopt a multilayer configuration having different electrical characteristics such as relative dielectric constant and resistivity. Alternatively, electrical characteristics such as relative dielectric constant and resistivity can vary in a direction normal to a pointer such as the finger F, that is, a film thickness direction of the black dielectric layer 3. In the film thickness direction, the relative dielectric constant of the black dielectric located closer to the capacitor pattern 12 can be higher, and the relative dielectric constant of the black dielectric located further from the capacitor pattern can be lower. From these viewpoints, the concentration of carbon contained in the black dielectric layer 3 can be adjusted in the thickness direction of the black dielectric layer 3. Furthermore, the state of dispersion of carbon can vary in the thickness direction of the black dielectric layer 3.

The black dielectric layer 3 may also have a gradient in a dielectric constant in the thickness direction. The relative dielectric constant of the black dielectric layer 3 may be partially high near the interface between the capacitor pattern 12 and the first insulating layer 17.

The transparent substrate 102 can be formed of a substrate having a low relative dielectric constant or a material having a relative dielectric constant of 8 or less. The relative dielectric constant of the transparent substrate 102 may be, for example, 5 or less. Further, a member located at the interface between the transparent substrate 102 and the capacitor pattern 12 preferably has a high relative dielectric constant. In other words, the black dielectric layer 3 located at the interface between the transparent substrate 102 and the capacitor pattern 12 preferably has a high relative dielectric constant.

Further, for example, when the black dielectric layer has a resistivity of $1\times10^{14}$ Ωcm or more, or even $1\times10^{15}$ Ωcm or more, it may be difficult to completely reset (for example, return to the ground potential) during a reset period after touch sensing is performed by a pointer such as the finger F. By setting the resistivity of the black dielectric layer 3 in the range of $10^8$ Ωcm or more and less than $10^{13}$ Ωcm, the reset period can be shortened. When the black dielectric layer has a resistivity less than $10^7$ Ωcm, sufficient capacitance cannot be ensured, leading to reduced accuracy in touch sensing.

Modified Example 2

Figure 9:
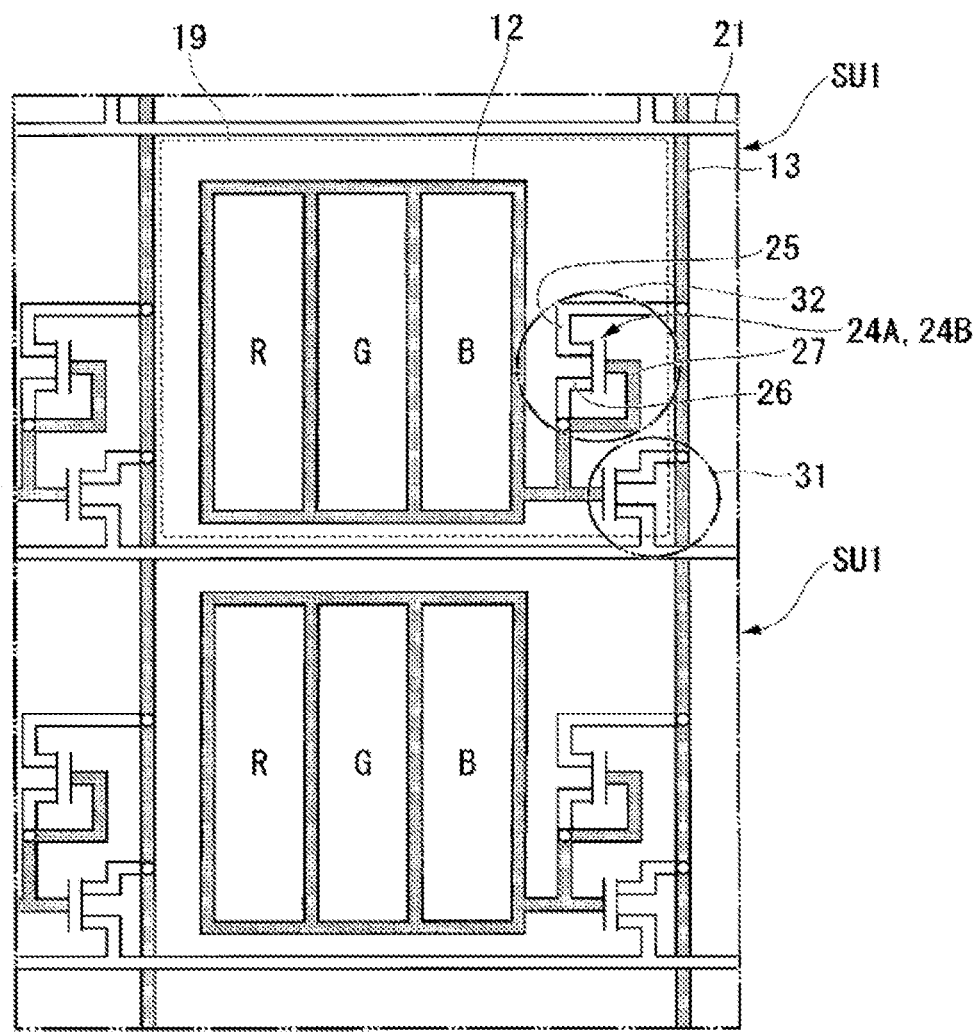
FIG. 9 is a circuit diagram of a sensor unit constituting a black matrix substrate according to a modified example of the first embodiment of the present invention.

FIG. 9 is a circuit diagram of a sensor unit constituting a black matrix substrate according to a modified example 2 of the first embodiment. As shown in FIG. 9, the black matrix substrate according to the modified example 2 includes a sensor unit SU1. The sensor unit SU1 includes a reset transistor 32 (second thin film transistor) in addition to the sensor unit SU having the first thin film transistor 31 shown in FIG. 1.

The reset transistor 32 includes a second gate electrode 27 electrically connected to the first gate electrode 11, a second source electrode 25, a second drain electrode 26 electrically connected to a second gate electrode 27 (second drain electrode 26 short-circuited to the second gate electrode 27), a second channel layer 24A, and a gate insulating layer 24B.

Part of the first conductive pattern 10 constitutes the second gate electrode 27. Part of the second conductive pattern 20 constitutes the second source electrode 25 and the second drain electrode 26. Part of the oxide semiconductor layer constitutes the second channel layer 24A. Part of the second insulating layer 48 constitutes the gate insulating layer 24B of the second thin film transistor. The second channel layer 24A is formed concurrently with the first channel layer 16. Similarly, the gate insulating layer 24B is formed concurrently with the second insulating layer 48.

In the modified example 2, the scanning line 13 not only supplies a scan signal to the first source electrode 22 of the first thin film transistor 31, but also supplies a reset signal (for example, ground potential) to the reset transistor 32. Supply of the scan signal and reset signal is performed using time division.

The reset transistor 32 receives a reset signal from the scanning line 13 and resets the potential of the capacitor pattern 12.

Modified Example 3

Figure 10:
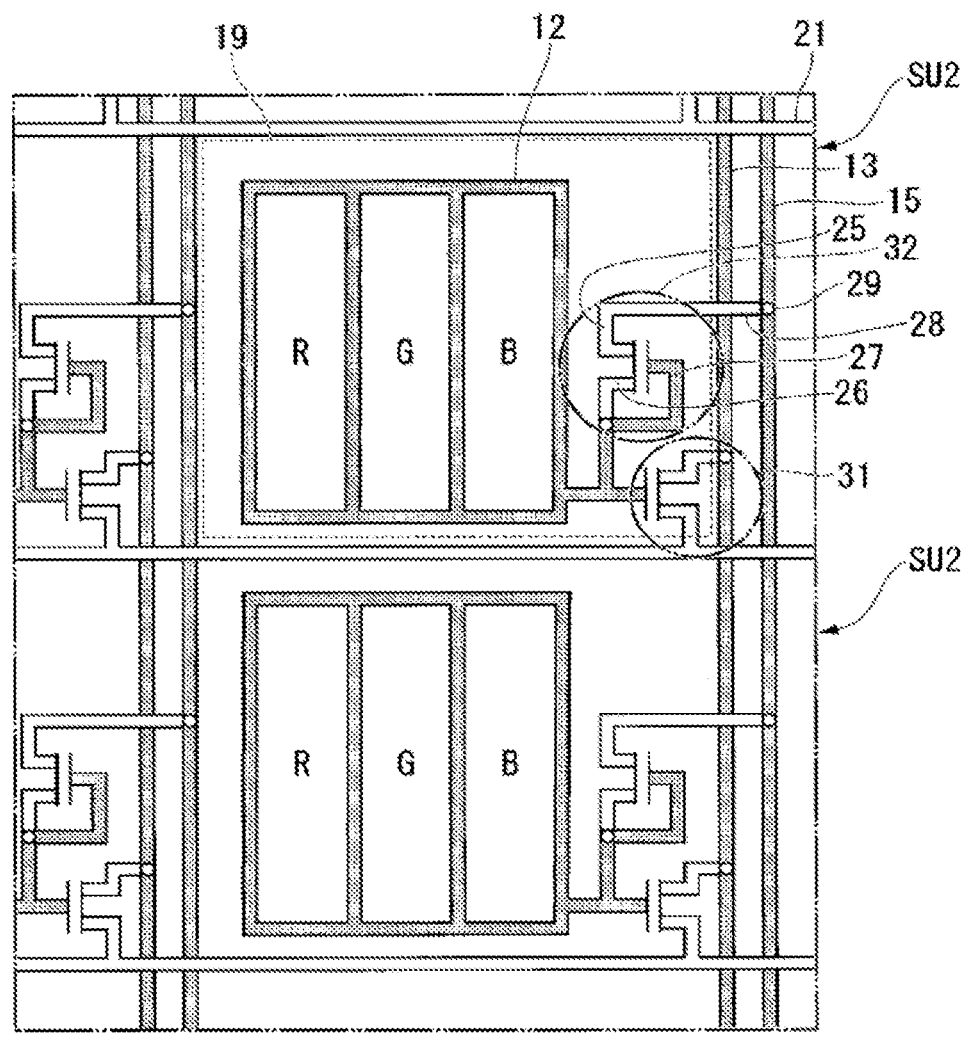
FIG. 10 is a circuit diagram of a sensor unit constituting a black matrix substrate according to a modified example of the first embodiment of the present invention.

FIG. 10 is a circuit diagram of a sensor unit constituting a black matrix substrate according to a modified example 3 of the first embodiment. In FIG. 10, the same members as those of the sensor unit SU1 shown in FIG. 9 will be referred to by the same reference signs and the description thereof will be omitted or simplified.

As shown in FIG. 10, the black matrix substrate according to the modified example 3 includes a sensor unit SU2. The sensor unit SU2 includes the reset transistor 32 shown in FIG. 9, a source extension line 28 extending from the second source electrode 25 of the reset transistor 32, and a reset line 15, in addition to the sensor unit SU having the first thin film transistor 31 shown in FIG. 1.

The reset line 15 supplies a reset signal to the reset transistor 32 via the second source electrode 25 and the source extension line 28.

The source extension line 28 is not connected to the scanning line 13, and is connected to the reset line 15 via the contact hole 29. In the circuit diagram shown in FIG. 10, the sensor unit SU2 receives a reset signal from the reset line 15, independently of a scan signal from the scanning line 13.

In the sensor unit SU2 shown in FIG. 9, time-division is not required for supply of the scan signal and reset signal. Similar to the sensor unit SU shown in FIG. 1, the scanning line 13 may supply only a scan signal to the first thin film transistor 31.

FIG. 1 is a circuit diagram in which one sensor unit includes one thin film transistor. FIGS. 9 and 10 are circuit diagrams in which one sensor unit includes two thin film transistors. However, more thin film transistors can be provided in one sensor unit as necessary.

Modified Example 4

Figure 11:
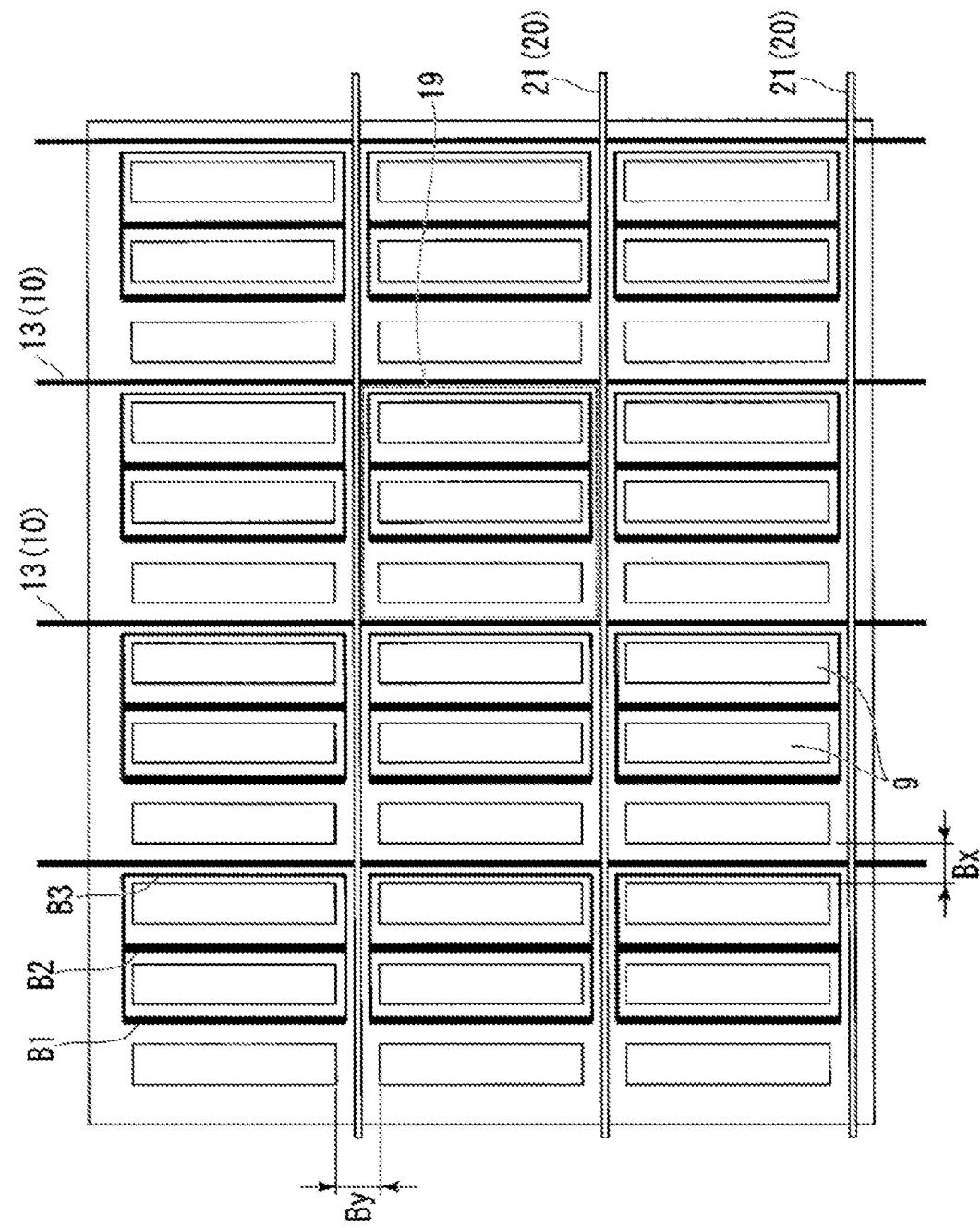
FIG. 11 is a partial enlarged view of a black matrix substrate according to a modified example of the first embodiment of the present invention, showing a plan view of an arrangement of a first conductive pattern of a first conductive layer and a second conductive pattern of a second conductive layer disposed on a black dielectric layer.

FIG. 11 is a partial enlarged view of a black matrix substrate according to a modified example 4 of the first embodiment, showing a plan view of an arrangement of the first conductive pattern 10 and the second conductive pattern 20 disposed on the black dielectric layer 3. Further, FIG. 11 illustrates a modified example of the capacitor pattern 12 shown in FIG. 3, in which two openings 9 are formed in each partitioned region 19.

The line width of the conductive wires B1, B2, and B3 constituting part of the capacitor pattern 12 may be different from each other.

Second Embodiment (Micro LED Display Device)

Figure 12:
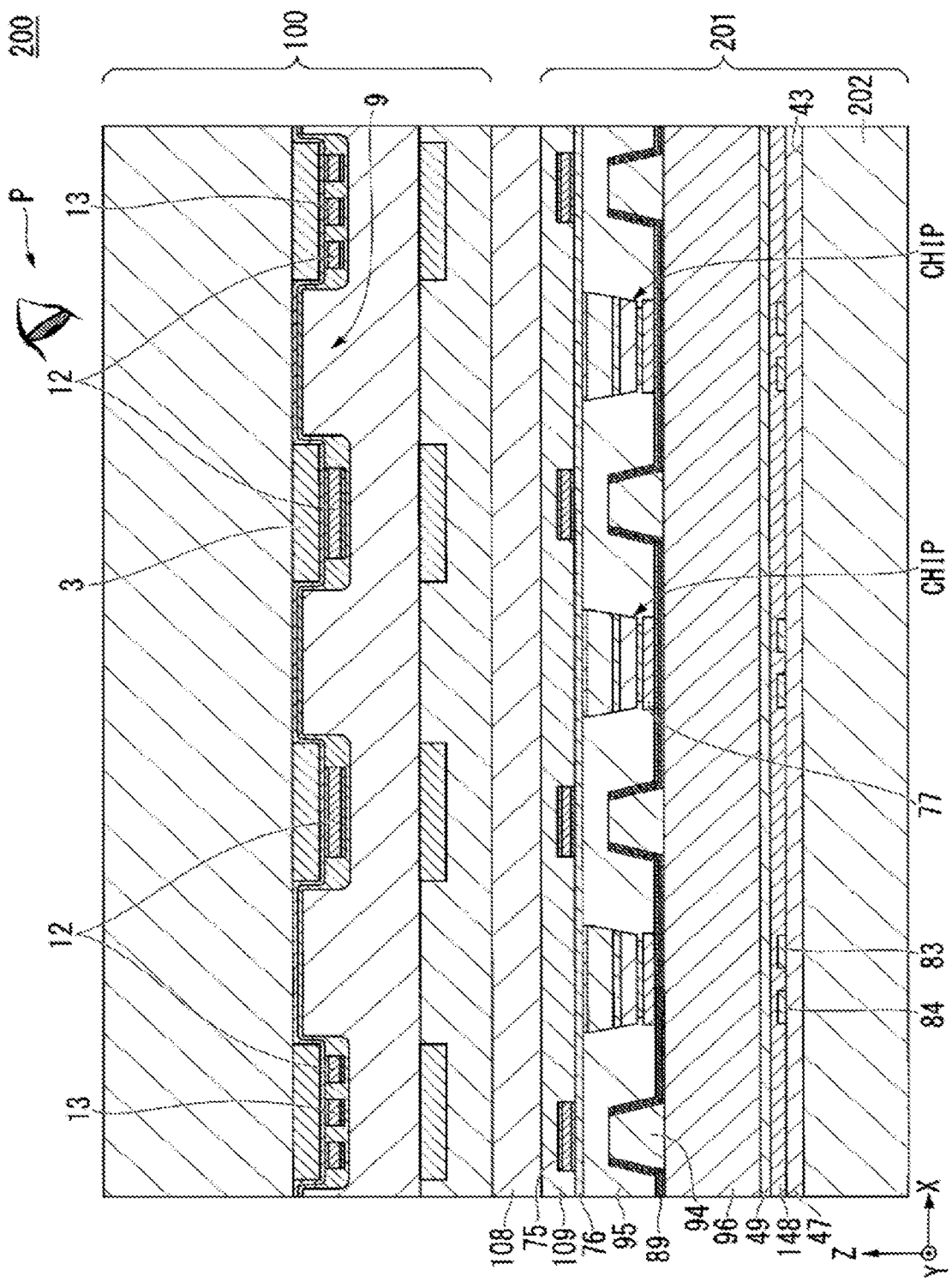
FIG. 12 is a view of a display device according to a second embodiment of the present invention, showing a partial cross-sectional view of a micro LED display device to which a black matrix substrate according to the first embodiment of the present invention is applied.

FIG. 12 is a view of a display device according to a second embodiment of the present invention, showing a partial cross-sectional view of a micro LED display device 200 to which the black matrix substrate 100 according to the first embodiment is applied.

In FIG. 12, the second surface 2 on which the sensor unit SU of the black matrix substrate 100 according to the first embodiment is disposed faces the second array substrate 201. A light emitting element CHIP is disposed on a surface of the second array substrate 201 that faces the second surface 2. The black matrix substrate 100 and the second array substrate 201 are bonded to each other with an adhesive layer 108, which is a transparent resin, interposed therebetween.

Further, in the black matrix substrate 100, which uses a capacitance detection method, the above black dielectric layer 3 is used. The sensor unit SU (unit cell, see FIG. 1) of the black matrix substrate 100 includes the capacitor pattern 12 and the first thin film transistor 31, and performs individual reading. The technique using such individual reading is a technique similar to a self-capacitive method.

Techniques disclosed in PTL 3 and PTL 4, which are examples of the related art of the display device, both use a mutual capacitive method, in which the X-direction wiring and the Y-direction wiring are used. These techniques differ from the second embodiment which uses a capacitance detection method by touch sensing. Further, in the technique disclosed in PTL 2, the capacitive element CS1 includes the electrode ECS, the electrode COM, which are translucent conductive films, and the insulating layer. PTL 2 does not disclose a configuration in which a black dielectric is stacked on the copper wiring.

(Second Array Substrate)

Next, with reference to FIGS. 13 to 15, a structure of the second array substrate 201 included in the micro LED display device 200 will be described.

Figure 13:
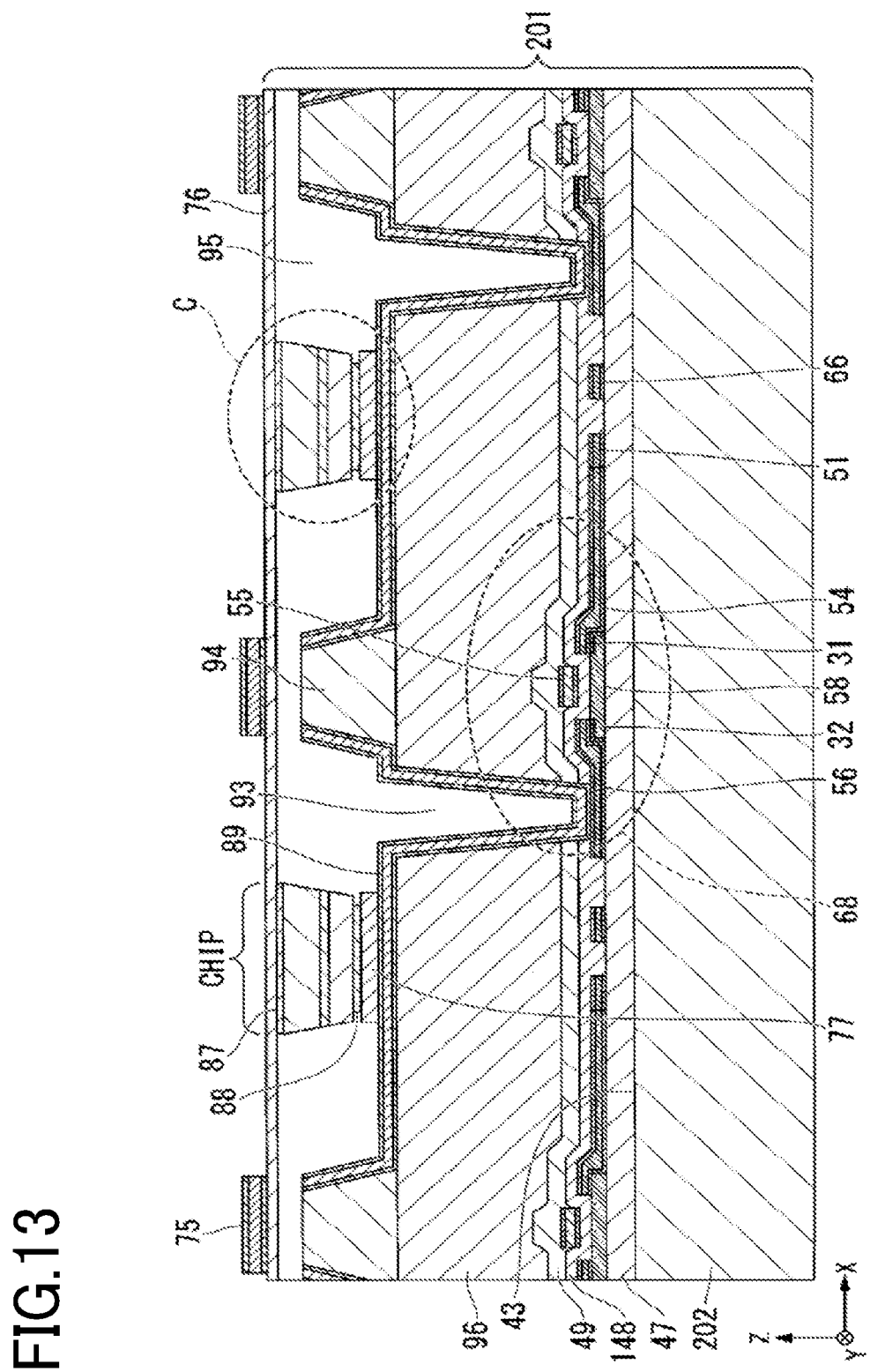
FIG. 13 is a view of a display device according to the second embodiment of the present invention, showing a partial cross-sectional view of an array substrate on which a micro LED is mounted.

FIG. 13 is an enlarged view partially illustrating the second array substrate 201 included in the micro LED display device 200 according to the second embodiment, showing a partial cross-sectional view of a third thin film transistor 68.

Figure 14:
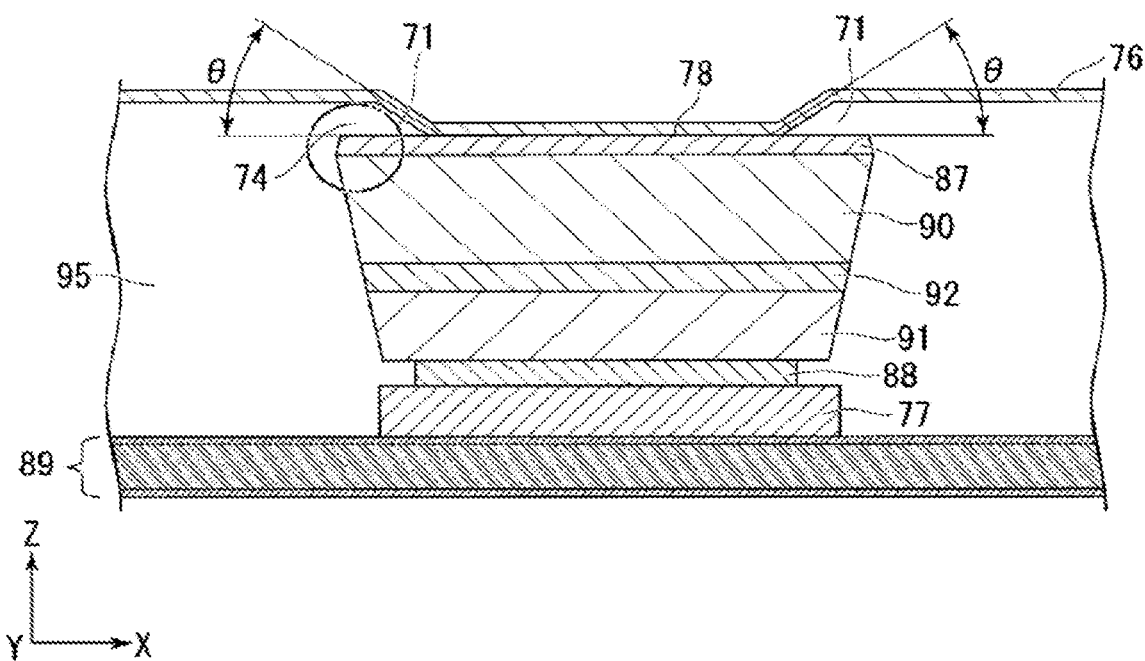
FIG. 14 is a view of a display device according to the second embodiment of the present invention, showing an enlarged cross-sectional view of a region indicated by reference sign C of FIG. 13.

FIG. 14 is a cross-sectional view partially illustrating a light emitting element (micro LED) mounted on the micro LED display device 200 according to the second embodiment, showing a partial enlarged view of a region indicated by reference sign C of FIG. 13.

Figure 15:
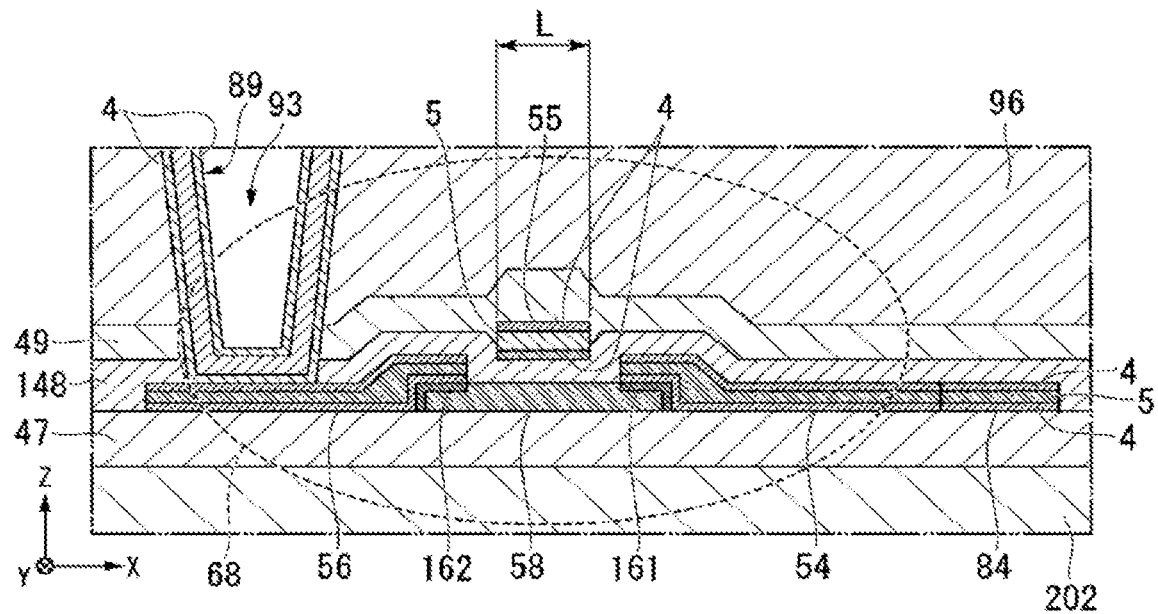
FIG. 15 is a view of a display device according to the second embodiment of the present invention, showing an enlarged cross-sectional view of a first thin film transistor of FIG. 13.

FIG. 15 is an enlarged cross-sectional view illustrating the micro LED display device 200 according to the second embodiment, showing a structure of a third source electrode 54 and a third drain electrode 56 overlapping with a third channel layer 58 of the third thin film transistor 68 shown in FIG. 13.

The material for forming the second substrate 202 of the second array substrate 201 is not limited to a transparent substrate. For example, a glass substrate, a ceramic substrate, a quartz substrate, a sapphire substrate, a semiconductor substrate such as silicon, silicon carbide, or silicon germanium, or a plastic substrate and the like can be used as the second substrate 202. The second substrate 202 may be a transparent, opaque, or colored substrate.

A fourth insulating layer 47 is formed on a surface 43 of the second substrate 202. On the fourth insulating layer 47, the third thin film transistor 68, a third insulating layer 148 formed to cover the fourth insulating layer 47 and the third thin film transistor 68, a third gate electrode 55 formed on the third insulating layer 148 to face the third channel layer 58 of the third thin film transistor 68, a sixth insulating layer 49 formed to cover the third insulating layer 148 and the third gate electrode 55, and a first flattening layer 96 formed to cover the sixth insulating layer 49 are stacked in this order.

In the first flattening layer 96, the sixth insulating layer 49, and the third insulating layer 148, a contact hole 93 is formed at a position corresponding to the third drain electrode 56 of the third thin film transistor 68. Furthermore, on the first flattening layer 96, a bank 94 (see FIG. 13) is formed at a position corresponding to the third channel layer 58. In a region between the banks 94 adjacent to each other in cross-sectional view, i.e., a region surrounded by the banks 94 in plan view, a reflective electrode 89 (pixel electrode) is formed to cover an upper surface of the first flattening layer 96, an inside of the contact hole 93, and the third drain electrode 56. The reflective electrode 89 may not necessarily be formed on the upper surface of the bank 94. The reflective electrode 89 is electrically connected to a lower electrode 88 of the light emitting element CHIP via a conductive joining layer 77.

A second flattening layer 95 is formed to fill the contact hole 93 and cover the reflective electrode 89 and the light emitting element CHIP. A transparent conductive film 76 called ITO is formed on the second flattening layer 95, and an upper electrode 87 constituting the light emitting element CHIP is connected to the transparent conductive film 76 (synonymous with the second power supply line 52). Further, an auxiliary conductor 75 is formed on the transparent conductive film 76, and the transparent conductive film 76 is electrically connected to the auxiliary conductor 75. In addition, a sealing layer 109 (adhesive layer) is formed on a surface of the transparent conductive film 76 to cover the auxiliary conductor 75. The auxiliary conductor 75 is a conductor for reducing the resistance of the transparent conductive film 76 in plan view.

The bank 94 may be made of an organic resin such as acrylic resin, polyimide resin, or novolak phenol resin. Further, an inorganic material such as silicon oxide or silicon oxynitride may be disposed on the bank 94.

The first flattening layer 96 and the second flattening layer 95 may be made of an acrylic resin, a polyimide resin, a benzocyclobutene resin, a polyamide resin, or the like. A low dielectric constant material (low-k material) may also be used.

In order to improve display clarity, any of the first flattening layer 96, the second flattening layer 95, and the sealing layer 109 may have a light scattering function.

In the contact hole 93 shown in FIGS. 13 and 15, the reflective electrode 89 is in contact with the third drain electrode 56 (fourth wiring). The reflective electrode 89 includes a conductive metal oxide layer as an upper layer, and the third drain electrode 56 is in contact with the conductive metal oxide layer.

As shown in FIG. 15, the reflective electrode 89 has a three-layer configuration in which a silver alloy is sandwiched between conductive metal oxide layers. Each of the conductive metal oxide layer of the reflective electrode 89 and the conductive metal oxide layer of the third drain electrode 56 are made of a conductive metal oxide, and can provide ohmic contact.

In the configuration shown in FIG. 15, if the surface in the contact hole 93 in contact with the reflective electrode 89 is an oxidized copper surface or aluminum, ohmic contact is difficult to obtain. Aluminum has insufficient physical adhesion to a conductive metal oxide such as ITO. The configuration employed in the micro LED display device according to the second embodiment can provide a wiring structure that can provide ohmic contact.

(Structure of Light Emitting Element CHIP)

In the present embodiment, the light emitting element CHIP is a vertical light emitting diode that functions as the display function layer, and is provided in each of the plurality of pixels on the second substrate 202.

The light emitting element CHIP has a structure in which the upper electrode 87, an n-type semiconductor layer 90, a light emitting layer 92, a p-type semiconductor layer 91, and the lower electrode 88 are stacked in this order. In other words, the light emitting element CHIP has a configuration in which the p-type semiconductor layer 91, the light emitting layer 92, the n-type semiconductor layer 90, and the upper electrode 87 are stacked in this order on the lower electrode 88. As shown in FIG. 13, the electrodes used for LED light emission are formed on different surfaces, and are formed on surfaces facing each other. Further, the upper electrode 87 and the lower electrode 88 are disposed on the outer surfaces of the n-type semiconductor layer 90 and the p-type semiconductor layer 91, respectively, which are arranged in parallel to each other. The light emitting element CHIP having such a structure is referred to as a vertical light emitting diode in the present embodiment. When the LED structure has an atypical shape such as a pyramid shape in a cross-sectional view, it is not used as the vertical light emitting diode of the present invention. A structure in which electrodes are arranged on one side of the LED structure, or a structure in which electrodes are arranged in the horizontal direction is referred to as a horizontal light emitting diode.

As shown in FIG. 14, in the light emitting element CHIP, the transparent conductive film 76 overlaps with the upper electrode 87 and is electrically connected thereto. A corner 74 of the light emitting element CHIP is covered with a second flattening layer 95. On the light emitting element CHIP, an overlapping portion 71 where the second flattening layer 95 and the upper electrode 87 overlap with each other is formed. Since the overlapping portions 71 are formed on both ends of the upper electrode 87, the second flattening layer 95 has a recessed shape on the upper electrode 87.

In FIG. 14, the second flattening layer 95 formed on the upper electrode 87 has a taper of an angle $\theta$ for the purpose of reducing the risk of disconnection in the transparent conductive film 76. The transparent conductive film 76 is formed to extend along the tapered surface of the second flattening layer 95.

Specifically, the overlapping portion 71 is located between the transparent conductive film 76 and the upper electrode 87 at the corner 74, and is inclined relative to the upper electrode 87 at the angle θ, for example, in the range of 5° to 70°. Since the overlapping portion 71 has an inclination as described above, disconnection in the transparent conductive film 76 can be prevented.

When an upper surface 78 (surface layer) of the light emitting element CHIP protrudes from the second flattening layer 95 and does not overlap with the second flattening layer 95, that is, when the overlapping portion 71 is not formed, the transparent conductive film 76 is subjected to disconnection, leading to a concern that defects may occur in illumination of the light emitting element CHIP.

Well-known photolithography is adopted as a method of forming the second flattening layer 95 having the recessed shape as described above and a method of forming the overlapping portion 71 overlapping with the light emitting element CHIP. Furthermore, in addition to the well-known photolithography method, a dry etching technique may also be applied.

The shape of the light emitting element CHIP may be, for example, a square shape having a side length of 3 μm to 500 μm in plan view. However, shapes other than square and rectangular may also be applied. Alternatively, the length of a side may be 500 μm or more. Further, one or more light emitting elements can be mounted on the pixels defined by the third gate wiring 69 and the third source wiring 66 (see FIG. 16) in plan view. In mounting of the light emitting element CHIP, the orientation of the light emitting element CHIP having a square shape, for example, can be randomly rotated in units of 90 degrees. The random mounting of the light emitting element CHIP can reduce unevenness in color and luminance over the entire screen caused by slight variation in LED crystal growth.

The lower electrode 88 may be made of a material such as silver, silver alloy, aluminum, or aluminum alloy. Further, the lower electrode 88 may have a configuration in which a silver or silver alloy layer is sandwiched between conductive metal oxide layers as described later. Part of the configuration of the lower electrode 88 may partially include a metal layer such as Ti layer, Cr layer, Pt layer, AuGe layer, Pd layer, Ni layer, TiW layer, or Mo layer, or a multilayer configuration including the conductive metal oxide layer described above. Further, by reducing the area proportion of the lower electrode 88 in plan view, a semi-transmissive or transmissive display device can be obtained.

The upper electrode 87 preferably has a configuration including a layer formed of a conductive metal oxide. In particular, at least the surface layer of the upper electrode 87 is preferably formed of a conductive metal oxide. Further, the conductive metal oxide constituting the surface layer of the upper electrode 87 is preferably electrically connected to a conductive layer formed of a conductive metal oxide.

For example, a conductive material that can fuse the lower electrode 88 of the light emitting element CHIP and the reflective electrode 89 in the temperature range of 150° C. to 340° C. to establish electrical connection therebetween can be applied to the joining layer 77. In the conductive material, a conductive filler such as silver, carbon, or graphite may be dispersed in a thermally flowable resin. Alternatively, the joining layer 77 can be formed by using In (indium), InBi alloy, InSb alloy, InSn alloy, InAg alloy, InGa alloy, SnBi alloy, SnSb alloy, or the like, or a low melting point metal, which is a ternary compound system or a quaternary compound system of these metals.

Since these low melting point metals have good wettability with the above conductive metal oxides, the lower electrode 88 and the reflective electrode 89 can be fused in a self-aligned manner after the lower electrode 88 and the reflective electrode 89 are roughly aligned with each other. Various energies such as heat, pressure, electromagnetic waves, laser light, and a combination of these and ultrasonic waves can be used to provide the energy required for the fusion. Further, vertical light emitting diodes are advantageous in ease of repair when joint failure occurs. For positioning of the light emitting diode (light emitting element CHIP) by self-alignment, a contact angle (wettability) of the lower electrode 88 and the reflective electrode 89 relative to the joining layer 77 that melts by heating can be reduced in fusion. Horizontal light emitting diodes in which electrodes are arranged in the same direction in the lower portion have disadvantages that it is difficult to inspect the joints of individual diodes, and that the electrodes are easily short-circuited during repair (replacement of a defective diode, etc.). From this viewpoint, vertical light emitting diodes are preferably used. The joining layer 77 can be patterned by known photolithography or a lift-off process after film formation such as vacuum deposition.

(Third Thin Film Transistor)

FIGS. 13 and 15 illustrate an example of a structure of the thin film transistor (TFT) having a top gate structure used as a third thin film transistor 68 connected to the reflective electrode 89 (pixel electrode). The structure of the third thin film transistor 68 is also applied to a fourth thin film transistor 67 described later.

The third thin film transistor 68 has a configuration in which the third source electrode 54 and the third drain electrode 56 are stacked on the third channel layer 58. Specifically, the third thin film transistor 68 includes the third drain electrode 56 connected to a first end of the third channel layer 58 (left end of the third channel layer 58 in FIG. 15), the third source electrode 54 connected to a second end of the third channel layer 58 (right end of the third channel layer 58 in FIG. 15), and a third gate electrode 55 disposed to face the third channel layer 58 with a gate insulating layer (third insulating layer 148) therebetween.

The third gate electrode 55 has the same configuration as that of the conductive layer 7 shown in FIG. 6. That is, the third gate electrode 55 has a three-layer configuration in which the metal layer 5 (alloy layer) is sandwiched between the conductive oxide layers 4.

The configuration of the third thin film transistor 68 includes a superposed region 161, which is an interface between the third channel layer 58 and the third source electrode 54, and a superposed region 162, which is an interface between the third channel layer 58 and the third drain electrode 56. At the interface between the third channel layer 58 and the conductive oxide layer 4, the contact resistance is small, and ohmic contact is obtained. Since the conductive oxide layer 4 has high conductivity, a conductive metal oxide having substantially high mobility is formed on the third channel layer 58. As a result, transistor characteristics can be improved. In FIG. 15, the conductive oxide layer 4 serves as a semiconductor layer having high mobility for the third channel layer 58.

As described later, the third channel layer 58 is formed of an oxide semiconductor, and in contact with the third insulating layer 148, which is the gate insulating layer. The third thin film transistor 68 drives the light emitting element CHIP.

Further, in the cross-sections of superposed regions 161 and 162 of the third channel layer 58, the third source electrode 54, the third drain electrode 56, and the third gate electrode 55 shown in the cross-sectional views of FIGS. 13 and 15, a tapered surface is not formed. For the purpose of avoiding disconnection of wiring or the like, a tapered surface (inclined surface) is preferably formed.

FIG. 13 illustrates a structure in which the third channel layer 58, the third source electrode 54, and the third drain electrode 56 constituting the third thin film transistor 68 are provided on the fourth insulating layer 47. However, the present invention is not limited to such a structure. The third thin film transistor 68 may also be directly formed on the second substrate 202 without providing the fourth insulating layer 47. Furthermore, a thin film transistor having a bottom-gate structure may be applied.

The third source electrode 54 and the third drain electrode 56 shown in FIG. 13 are concurrently formed in the same step. Further, the third source electrode 54 and the third drain electrode 56 include conductive layers having the same configuration. That is, in the second embodiment, the third source electrode 54 and the third drain electrode 56 each have a three-layer configuration in which a copper layer or a copper alloy layer is sandwiched between conductive oxide layers. In addition, the third source electrode 54 and the third drain electrode 56 may have a three-layer structure of titanium/aluminum alloy/titanium, molybdenum/aluminum alloy/molybdenum, or the like. As the aluminum alloy, aluminum-neodymium is a typical example.

A back gate electrode may also be provided in order to stabilize a threshold voltage (Vth) of the third thin film transistor 68 or obtain stable normally-off transistor characteristics. The back gate electrode can be formed by patterning a metal film so as to face the third gate electrode 55 of FIG. 13 with the third channel layer 58 interposed therebetween, for example, at the interface between the fourth insulating layer 47 and the second substrate 202. The back gate electrode formed of a metal film prevents external light being incident on the third channel layer 58, obtaining a stable positive Vth. Usually, a negative voltage is applied to the back gate electrode. An electric field formed between the third gate electrode 55 and the back gate electrode can electrically surround the third channel layer 58. This electric field can increase the drain current of the third thin film transistor 68, and also decrease a leakage current, which is the off current of the third thin film transistor 68. Therefore, the size of the third thin film transistor 68 can be small due to the drain current required for the third thin film transistor 68, which enables a highly integrated semiconductor circuit.

Since the thin film transistor having a channel layer formed of an oxide semiconductor has a quite small leakage current, high stability is obtained after the input of a scan signal and a video signal. A thin film transistor having a channel layer formed of a polysilicon semiconductor has a leakage current larger than that of an oxide semiconductor transistor by two orders of magnitude or more. A small leakage current is preferred since it contributes to highly accurate touch sensing.

IGZO (indium oxide, zinc oxide, and gallium oxide), which is a typical complex oxide of the oxide semiconductor can be applied to the channel layer of the thin film transistor according to the present embodiment. Oxide semiconductors called IGZO are collectively manufactured by vacuum deposition such as sputtering. After the oxide semiconductor is formed, heat treatment after the patterning of the TFT or the like is also collectively performed. Therefore, variations in electrical characteristics (for example, Vth) related to the channel layer are quite small. In driving of the LED, the variation in Vth of the thin film transistor needs to be minimized to reduce the variation in luminance of the LED. However, in order to ensure reliability by crystallization, the oxide semiconductor called IGZO typically undergoes heat treatment at the temperature in the range of 400° C. to 700° C. (high temperature annealing). In the manufacturing steps of a liquid crystal display device or the like, diffusion of copper occurs during this heat treatment, which often significantly degrades the conductivity of the copper wiring.

Annealing at a temperature higher than 350° C. may increase copper diffusion, and in some cases, may deteriorate characteristics of the oxide semiconductor. In the conventional configuration in which the copper line is made of Mo/Cu or Ti/Cu, heat treatment at a temperature higher than 400° C. causes interdiffusion of copper and titanium or the like, which may deteriorate the electrical resistivity of the copper line.

An oxide semiconductor of a complex oxide mainly composed of two oxides, indium oxide and antimony oxide, which can be annealed at a low temperature in the range of 180° C. to 340° C., can be applied. Further, the oxide semiconductor constituting the third channel layer 58 can contain cerium oxide in the oxide semiconductor. When the total of elements excluding oxygen is 100 at % (in terms of metal element), the amounts of cerium is in the range of 0.2 at % or more and 10 at % or less. More specifically, the oxide semiconductor is a complex oxide including indium oxide, antimony oxide, and cerium oxide at an amount smaller than that of the indium oxide and smaller than that of the antimony oxide, and, when the total of elements excluding oxygen is 100 at %, the amounts of indium and antimony are each 40 at % or more. For example, when the total of elements in the oxide semiconductor excluding oxygen is 100 at %, the amounts of indium and antimony are each 40 at %, and the amount of cerium is 4 at %. In addition, antimony oxide and cerium oxide, which are available inexpensively unlike gallium oxide and indium oxide, have high industrial value.

In order to control electrical characteristics and mobility of the oxide semiconductor, for example, indium oxide concentration and cerium oxide concentration may be modified in the thickness direction of the third channel layer 58. Alternatively, the third channel layer 58 may be formed of a plurality of layers having different cerium oxide concentrations. Alternatively, in order to increase wet-etching processability of the source electrode and the like, the composition of the surface layer of the third channel layer 58 can be enriched in cerium oxide to improve the acid resistance of the third channel layer 58. Although an etching stopper layer can be provided on the third channel layer 58, a complex oxide thin film containing cerium oxide becomes highly acid resistant by annealing at 180° C. or higher, so an etching stopper layer may not be necessarily provided and formation of an etching stopper layer can be omitted. The acid resistance can also be obtained by increasing the concentration of cerium oxide in the complex oxide film.

The same applies to the oxide semiconductor layer containing tin oxide. In a complex oxide mainly containing indium oxide, the acid resistance of the complex oxide is improved by increasing the concentration of tin oxide. As with the case of an oxide semiconductor layer containing cerium oxide, the acid resistance can be further improved by annealing at 180° C. or higher. When both cerium oxide and tin oxide are added to a complex oxide mainly containing indium oxide, the acid resistance can also be improved and an etching stopper layer can be omitted.

Further, the annealing temperature may be in the range of 180° C. to 340° C., and is preferably higher than 200° C. The resistance of the oxide semiconductor layer (complex oxide film) to the etchant can be improved, for example, by pre-annealing at approximately 220° C. before patterning of the source electrode or the like. The pre-annealing may also be performed before film formation of the conductive layer for forming a source electrode.

(Driving of Light Emitting Diode Element)

Figure 16:
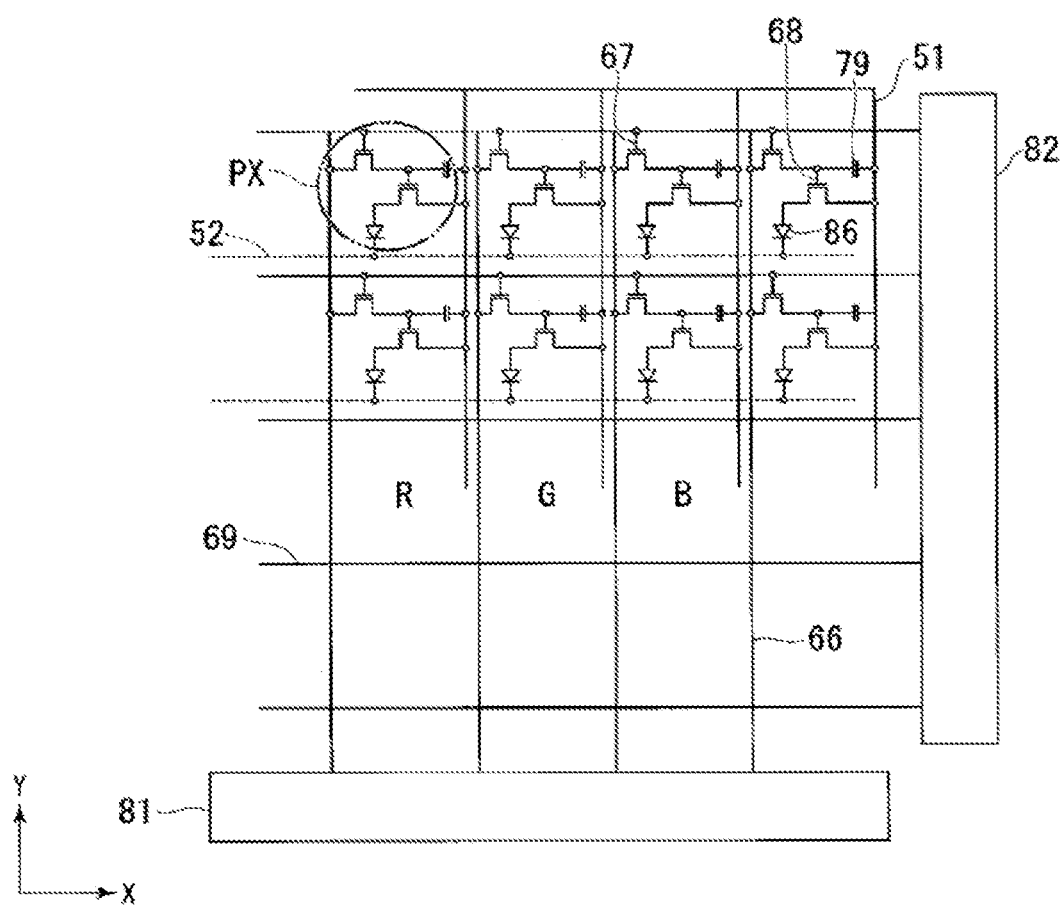
FIG. 16 is a representative circuit diagram including a thin film transistor configured to drive a micro LED applied to a display device according to the second embodiment of the present invention.

FIG. 16 is a representative circuit diagram including a thin film transistor configured to drive a micro LED. In the second embodiment, a light emitting element CHIP is illustrated as the light emitting diode element. A plurality of pixels PX are arranged in a matrix. Hereinafter, the pixel PX may also be referred to as a pixel opening PX.

Further, the circuit diagram shown in FIG. 16 can be applied to an organic EL display device 300 according to a third embodiment described later. In this case, an organic EL layer is used as the light emitting diode element.

In FIG. 16, which schematically illustrates the plurality of pixels PX, each pixel PX is a pixel opening PX defined by the source wiring 66 (third source wiring), which is a video signal line, and the gate wiring 69 (third gate wiring), which is a scanning line.

The third thin film transistor 68 is connected to the first power supply line 51 via the third source electrode 54. The first power source line 51 is a power source line that supplies power to the light emitting element 86 (light emitting element CHIP). The second power supply line 52 is connected to the upper electrode 87 which constitutes the light emitting element 86 via the transparent conductive film 76 and the auxiliary conductor 75. The second power source line 52 is maintained at a constant potential, and may be grounded to, for example, a ground (housing or the like). The auxiliary conductor 75 can be made of metal wiring having good conductivity, and can be formed at positions avoiding the pixel openings (pixels PX). The auxiliary conductor 83 shown in FIG. 19 has a laminated configuration of a conductive metal oxide, a copper alloy, and a conductive metal oxide. Using copper or copper alloy having good thermal conductivity for part of the configuration of the auxiliary conductor 75 facilitates heat dissipation of the light emitting diode element so that stable light emission can be obtained.

As shown in FIG. 16, the third thin film transistor 68, the fourth thin film transistor 67, the light emitting element 86, a capacitive element 79 and the like are arranged in the pixels PX (pixel openings) defined by the source wiring 66 and the gate wiring 69.

The fourth thin film transistor 67 is electrically linked to the source wiring 66 and the gate wiring 69. The third thin film transistor 68 is electrically linked to the fourth thin film transistor 67 and the first power supply line 51. The third thin film transistor 68 receives a signal from the fourth thin film transistor 67 to drive the light emitting element 86, which is a vertical light emitting diode. The third gate electrode 55 of the third thin film transistor 68 is connected to the first power source line 51 via the capacitive element 79. The third thin film transistor 68 and the fourth thin film transistor 67 constitute the thin film transistor array.

FIG. 16 illustrates main electric elements including the first power supply line 51 disposed on the surface 43 of the second substrate 202. The plurality of pixels PX arranged in a matrix constitute the effective display region of the display device. In addition to the thin film transistors 67 and 68 shown in FIG. 16, a thin film transistor for resetting capacitance and the like may be additionally provided as a switching element. In this case, the switching element for resetting capacitance is connected to a reset signal line formed on the surface 43 of the second substrate 202.

The gate wiring 69 is connected to a scan driving circuit 82 (gate signal switching circuit) including a shift register. The source wiring 66 is connected to a source signal circuit 81 (source signal switching circuit) including a shift register, a video line, and an analog switch. The source signal circuit 81 and the scan driving circuit 82 receive a signal from the display control unit to control the light emitting element 86, which is a display functional layer.

In the present embodiment, the first power supply line 51 and the source wiring 66 extend in the Y direction (second direction). The gate line 69 extends in the X direction (first direction).

In the present embodiment, the positional relationship among the source wiring 66, the gate wiring 69, and the first power supply line 51, and the second power supply line 52 is not limited.

The number of thin film transistors in each pixel PX or the orientation of the auxiliary conductor 75 can be varied to change the direction of pattern of the transparent conductive film 76.

In each of the plurality of pixels PX, when the fourth thin film transistor 67 is turned on upon reception of a gate signal from the gate wiring 69 and a video signal from the source wiring 66, a signal from the fourth thin film transistor 67 which serves as a switching transistor (output from the drain electrode) is outputted to the third gate electrode 55. That is, an ON signal is inputted to the third gate electrode 55 of the third thin film transistor 68 that supplies power to the pixel PX. The third thin film transistor 68, which is a drive transistor, receives a signal from the third gate electrode 55, and supplies power to the light emitting element 86 from the first power source line 51. The current is supplied from the first power source line 51 to the light emitting element 86 via the third channel layer 58 of the third thin film transistor 68, and the pixel PX (light emitting element 86) emits light according to the current.

Third Embodiment (Organic EL Display Device)

Figure 17:
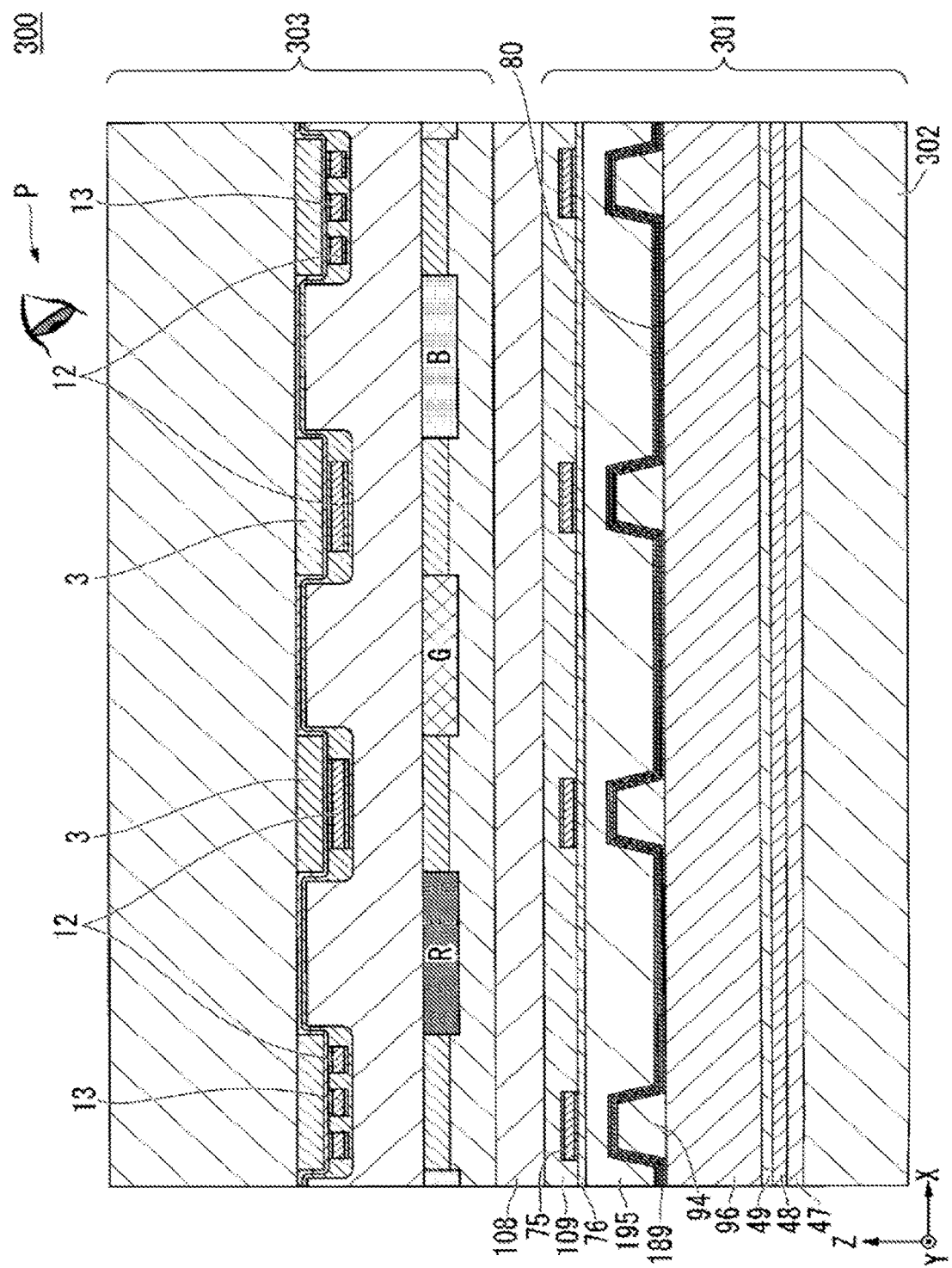
FIG. 17 is a view of a display device according to a third embodiment of the present invention, showing a partial cross-sectional view of an organic EL display device to which a black matrix substrate is applied.

FIG. 17 is a view of a display device according to a third embodiment of the present invention, showing a partial cross-sectional view of the organic EL display device 300 to which a third black matrix substrate 303 is applied.

Figure 18:
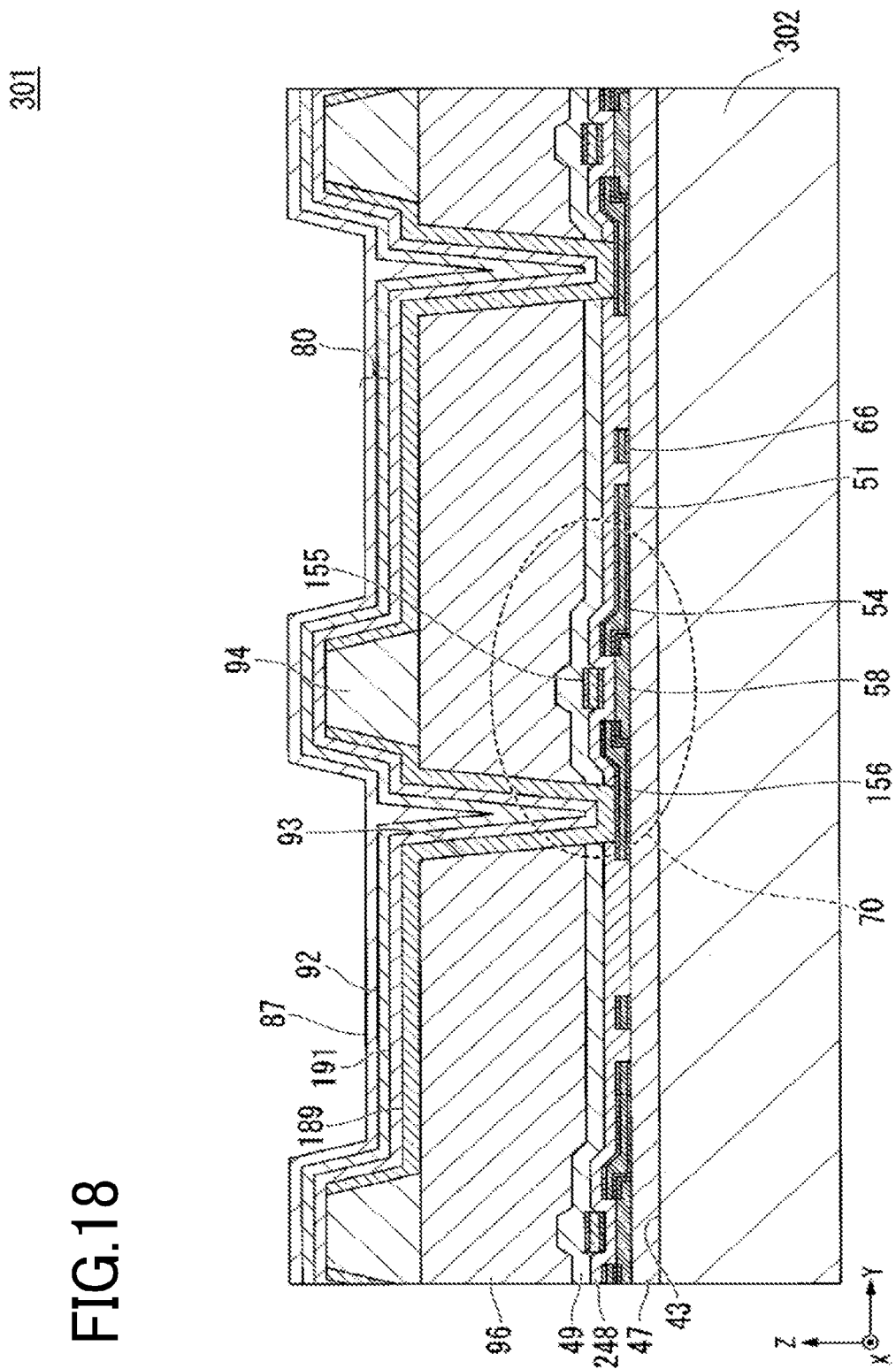
FIG. 18 is a view of a display device according to the third embodiment of the present invention, showing a partial cross-sectional view of an array substrate on which an organic EL layer is mounted.

FIG. 18 is a partial cross-sectional view of an array substrate 301 on which an organic EL layer is mounted in the organic EL display device 300 according to the third embodiment.

In the organic EL display device 300, the third black matrix substrate 303 and the third array substrate 301 having an organic EL layer 80 are bonded to each other. The third black matrix substrate 303 includes color filters including the red pixel R, the green pixel G, and the blue pixel B. The red pixel R, the green pixel G, and the blue pixel B are provided in the openings of the light-absorbing layer 8.

The remaining configuration of the third black matrix substrate 303 is the same as that of the black matrix substrate 100 described in the first embodiment. The organic EL layer 80 including the light emitting layer 92 will be described in detail later.

Next, a structure of the organic EL display device 300 will be described.

A third substrate 302 of the third array substrate 301 is not limited to a transparent substrate. For example, a glass substrate, a ceramic substrate, a quartz substrate, a sapphire substrate, a semiconductor substrate such as silicon, silicon carbide, or silicon germanium, or a plastic substrate and the like can be used as a substrate.

A fourth insulating layer 47 is formed on the third substrate 302 of the third array substrate 301. On the fourth insulating layer 47, a fifth thin film transistor 70, a fifth insulating layer 248 formed to cover the fourth insulating layer 47 and the fifth thin film transistor 70, a fifth gate electrode 155 formed on the fifth insulating layer 248 to face the third channel layer 58 of the fifth thin film transistor 70, a sixth insulating layer 49 formed to cover the fifth insulating layer 248 and the fifth gate electrode 155, and a first flattening layer 96 formed to cover the sixth insulating layer 49 are stacked in this order.

In the first flattening layer 96, the sixth insulating layer 49, and the fifth insulating layer 248, a contact hole 93 is formed at a position corresponding to the fifth drain electrode 156 of the fifth thin film transistor 70. Furthermore, on the first flattening layer 96, a bank 94 is formed at a position corresponding to the third channel layer 58. In a region between the banks 94 adjacent to each other in cross-sectional view, i.e., a region surrounded by the banks 94 in plan view, a lower electrode 189 (pixel electrode) is provided so as to cover an upper surface of the first flattening layer 96, an inside of the contact hole 93, and the fifth drain electrode 156. The lower electrode 189 may not necessarily be formed on the upper surface of the bank 94.

Furthermore, a hole injection layer 191 is provided so as to cover the lower electrode 189, the bank 94, and the first flattening layer 96. A light emitting layer 92, the upper electrode 87, and a sealing layer 195 are stacked in this order on the hole injection layer 191.

As will be described later, the lower electrode 189 has a configuration in which a silver layer or a silver alloy layer is sandwiched between conductive oxide layers.

The upper electrode 87 is a transparent conductive film in which, for example, a silver alloy layer having a film thickness of 11 nm is sandwiched between complex oxide layers having a film thickness of 40 nm. The lower electrode 88 has a configuration in which a silver alloy layer having a film thickness of 250 nm is sandwiched between complex oxide layers having a film thickness of 30 nm. Preferably, the above complex oxide layer is applied to the conductive metal oxide layer, a film thickness of the silver alloy layer is, for example, in the range of 9 nm to 15 nm, and a three-layer structure in which the silver alloy layer is sandwiched between the conductive metal oxide layers is used. In this case, a transparent conductive film having a high transmittance is achieved.

Alternatively, it is also possible that the above complex oxide layer may be applied to the conductive metal oxide layer, a film thickness of the silver alloy layer is, for example, in the range of 100 nm to 250 nm, or 300 nm or more, and a three-layer laminate structure in which the silver alloy layer is sandwiched between the conductive metal oxide layers is used. In this case, a reflection electrode having a high visible light reflectance is achieved.

The bank 94 may be made of an organic resin such as acrylic resin, polyimide resin, or novolak phenol resin. Further, an inorganic material such as silicon oxide or silicon oxynitride may be disposed on the bank 94.

The material of the first flattening layer 96 may be acrylic resin, polyimide resin, benzocyclobutene resin, polyamide resin, or the like. A low dielectric constant material (low-k material) may also be used.

In order to improve display clarity, any of the first flattening layer 96, the sealing layer 109, and the third substrate 302 may have a light scattering function. Alternatively, a light scattering layer may be formed above the third substrate 302.

The structure of the fifth thin film transistor is the same as that of the second embodiment, and will not be described further.

Fourth Embodiment (Liquid Crystal Display Device)

Figure 19:
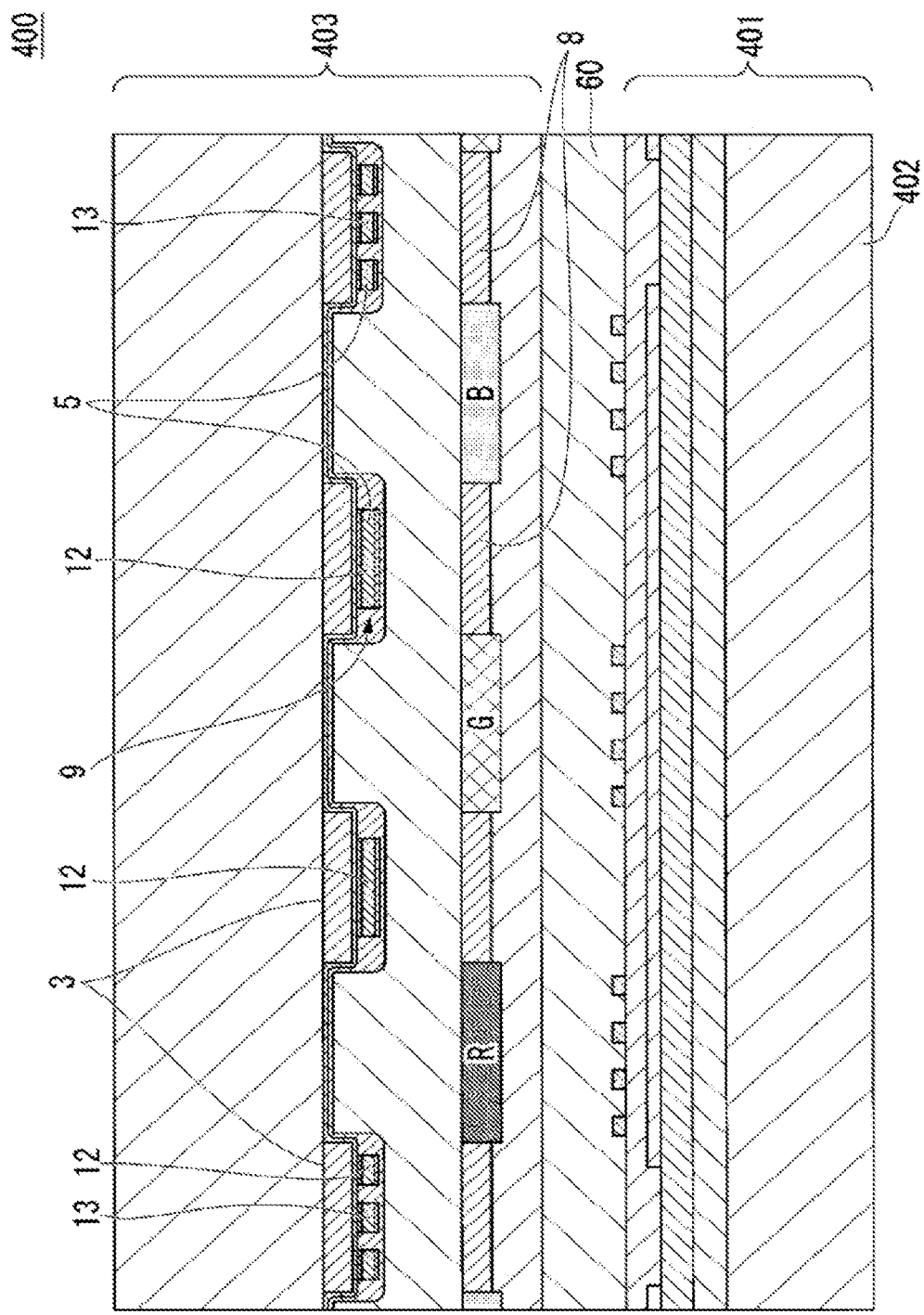
FIG. 19 is a view of a display device according to a fourth embodiment of the present invention, showing a partial cross-sectional view of a liquid crystal display device to which a black matrix substrate is applied.

FIG. 19 is a view of a display device according to a fourth embodiment of the present invention, showing a partial cross-sectional view of a liquid crystal display device 400 to which a fourth black matrix substrate 403 is applied.

Figure 20:
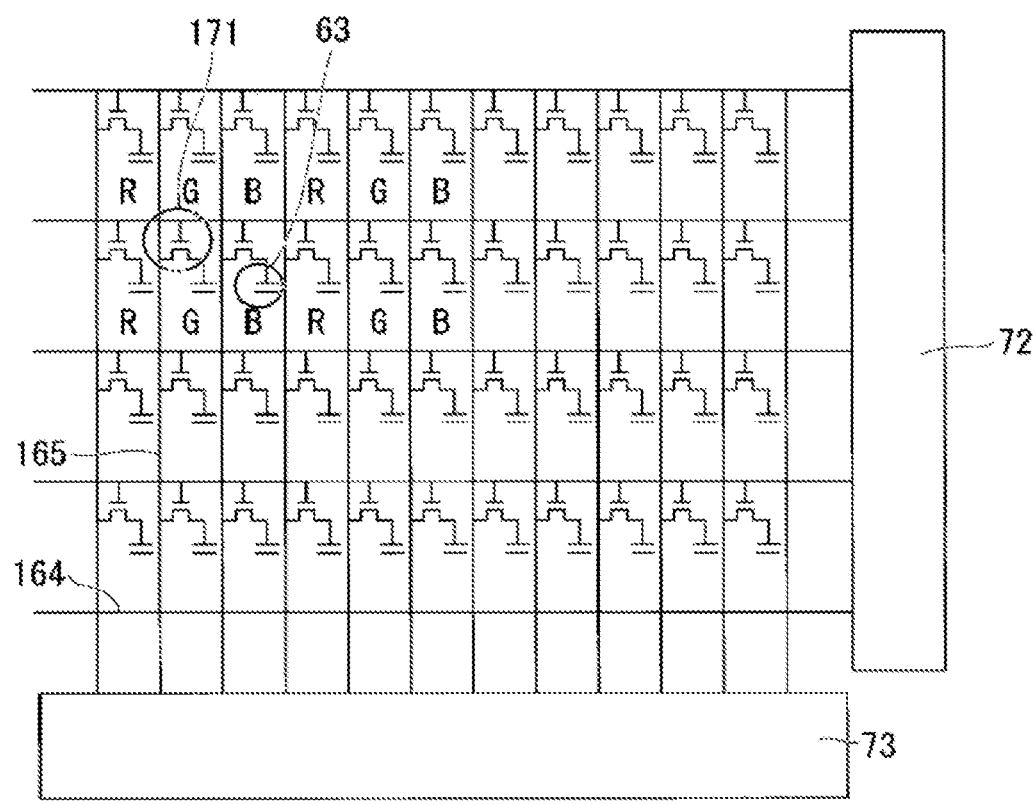
FIG. 20 is a representative circuit diagram including a thin film transistor configured to drive a liquid crystal layer applied to a display device according to the fourth embodiment of the present invention.

FIG. 20 is a representative circuit diagram including a thin film transistor configured to drive a liquid crystal layer applied to a display device according to the fourth embodiment.

Figure 21:
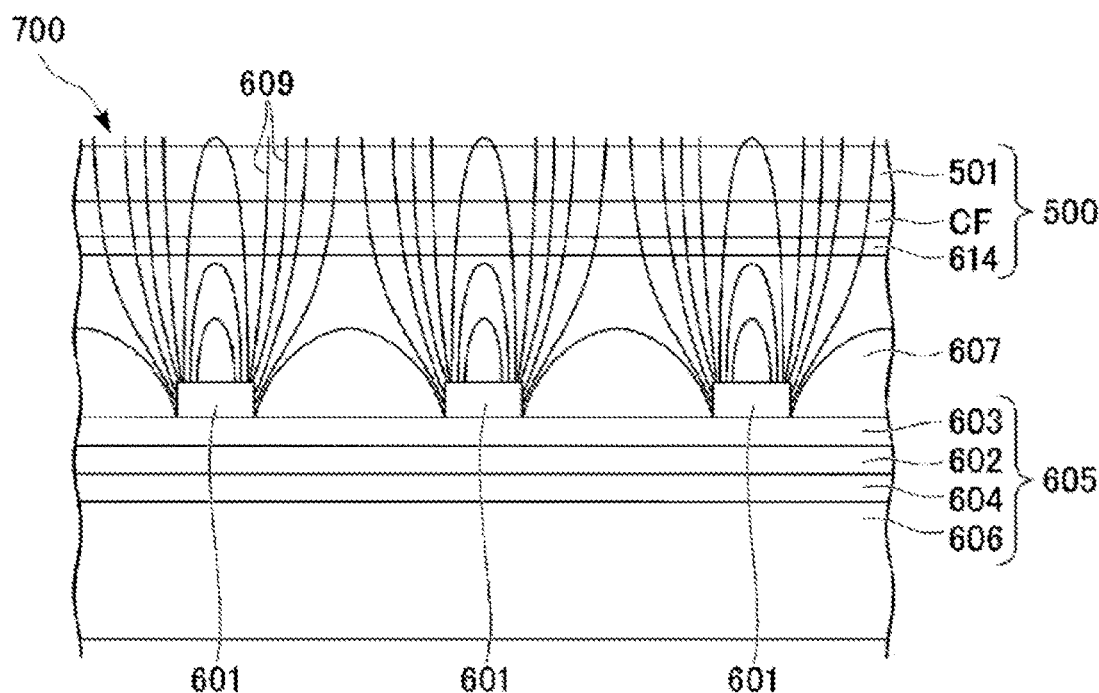
FIG. 21 is a partial cross-sectional view of a conventional horizontal alignment (FFS mode) liquid crystal display device, illustrating the state of equipotential lines when a liquid crystal driving voltage is applied across pixel electrodes and common electrodes.

FIG. 21 is a partial cross-sectional view of a conventional horizontal alignment (FFS mode) liquid crystal display device, illustrating the state of equipotential lines when a liquid crystal driving voltage is applied across pixel electrodes and common electrodes.

Figure 22:
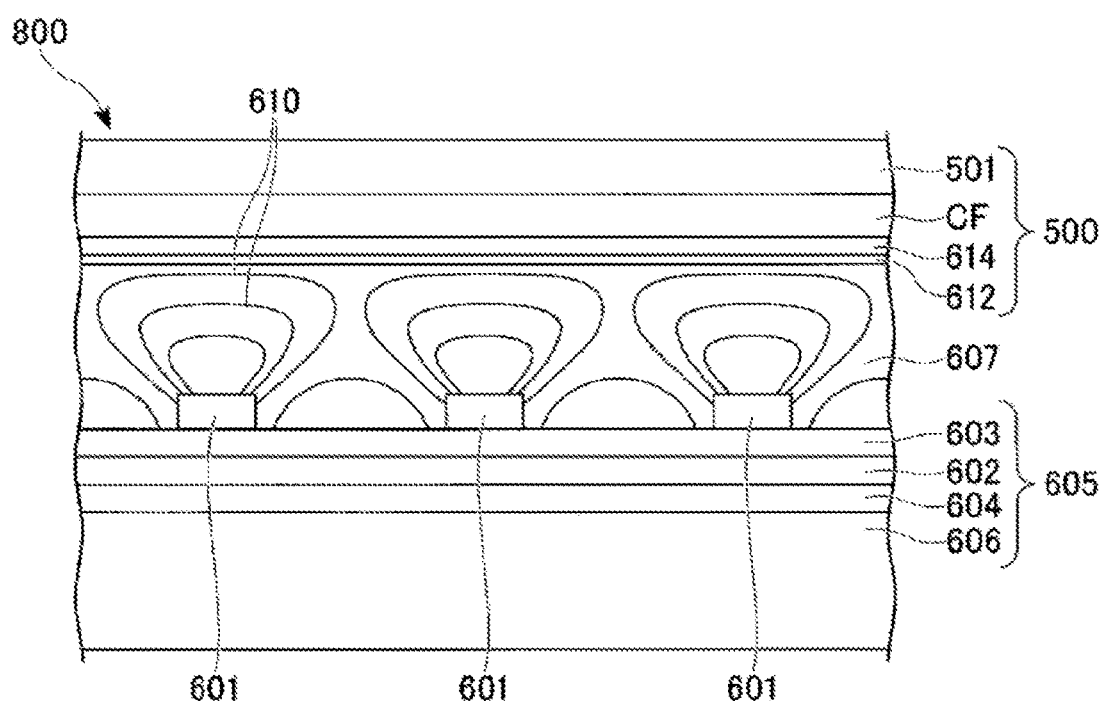
FIG. 22 is a partial cross-sectional view of a conventional horizontal alignment (FFS mode) liquid crystal display device, illustrating the state of equipotential lines when a transparent electrode is disposed on a transparent resin layer of a substrate.

FIG. 22 is a partial cross-sectional view of a conventional horizontal alignment (FFS mode) liquid crystal display device, illustrating the state of equipotential lines when a transparent electrode is disposed on a transparent resin layer of a facing substrate.

The liquid crystal display device 400 has a configuration in which the second surface 2 on which the sensor unit SU of the fourth black matrix substrate 403 is bonded to a fourth array substrate 401 via a liquid crystal layer 60.

In FIG. 19, an optical film including a polarizing plate, an alignment layer, a back light unit, and the like are not shown. Further, a thin film transistor is not shown since active elements such as a thin film transistor are known in the typical liquid crystal display device.

The fourth black matrix substrate 403 has the same configuration as that of the third black matrix substrate 303 of the third embodiment. Color filers including the red pixel R, the green pixel G, and the blue pixel B are provided in the openings of the light-absorbing layer 8.

In the present embodiment, the liquid crystal layer 60 is a horizontal alignment liquid crystal layer, which is called an FFS mode. However, the present embodiment is not limited to the horizontal alignment or FFS mode. A vertical alignment liquid crystal layer may also be used so that the liquid crystal layer is driven by a vertical electric field (a driving voltage applied in the thickness direction of the liquid crystal layer).

The pixel electrode and the common electrode that drive the liquid crystal layer 60 are formed by patterning a transparent conductive film into an electrode shape.

As shown in FIG. 20, one active element is disposed as a sixth thin film transistor 171 in each of the red pixel R, the green pixel G, and the blue pixel B. The liquid crystal is shown in FIG. 20 as a capacitive element 63. The sixth thin film transistor 171 is driven by a gate wiring 164 extending from a scan signal circuit 72, and a source wiring 165 extending from a video signal circuit 73.

The aforementioned PTL 2 and PTL 3 disclose liquid crystal display devices which use a transparent conductive oxide or a translucent conductive film (hereinafter, referred to as a transparent electrode) as a touch sensor. In the touch sensor disclosed in PTL 2 and PTL 3, the liquid crystal layer is driven by an array substrate disposed to face the touch sensor. In other words, the transparent electrode used for the touch sensor is substantially in contact with the liquid crystal layer.

In recent years, a horizontal alignment liquid crystal mode, called FFS (or IPS), has mainly been adopted as a liquid crystal type from the viewpoint of viewing angle, contrast, and responsiveness.

FIG. 21 shows a known typical configuration of an FFS mode liquid crystal display device 700. The liquid crystal display device 700 has a structure in which a liquid crystal layer 607 is sandwiched between an array substrate 605 and a color filter substrate 500.

The array substrate 605 includes an insulating layer 604 formed on a substrate 606, a common electrode 602 formed on the insulating layer 604, an insulating layer 603 formed on the common electrode 602, and a pixel electrode 601 formed on the insulating layer 603.

In the color filter substrate 500 facing the array substrate 605, a color filter CF made of a material that does not pass an electric current (non-conductor), a transparent resin layer 614, and the like are stacked on the transparent substrate 501. Further, in the example shown in FIG. 21, an alignment layer is omitted.

In the array substrate 605 of the liquid crystal display device 700, the liquid crystal layer 607 is driven by a voltage applied between the pixel electrode 601 and the common electrode 602. As shown in FIG. 21, equipotential lines 609 that indicate the electric field generated from the pixel electrode 601 extend from the pixel electrode 601 toward the color filter CF through the liquid crystal layer 607 such that the horizontal alignment liquid crystal of the liquid crystal layer 607 horizontally rotates about the equipotential lines 609. Thus, the liquid crystal display device 700 performs standard display.

On the other hand, another known FFS mode liquid crystal display device is shown in FIG. 22, in which a liquid crystal display device 800 includes a color filter substrate 500 having a transparent electrode 612 that covers a transparent resin layer 614. The transparent electrode 612 is used as a driving electrode or a detection electrode for touch sensing.

In the liquid crystal display device 800, the liquid crystal layer 607 is disposed between the transparent electrode 612 and the pixel electrode 601. The liquid crystal display device 800 differs from the liquid crystal display device 700 in that the transparent electrode 612 is formed in the color filter substrate 500. The remaining configuration of the liquid crystal display device 800 is the same as that of the liquid crystal display device 700.

As shown in FIG. 22, in the configuration in which the transparent electrode 612 is formed in the color filter substrate 500, driving of the FFS mode liquid crystal is hindered. The equipotential lines 610 extending from the pixel electrode 601 toward the color filter substrate 500 cannot pass through the transparent electrode 612, which is a conductive film. Accordingly, as shown in FIG. 22, the shape of the equipotential lines 610 is deformed as if the equipotential lines 610 are confined between the color filter substrate 500 and the array substrate 605. With the equipotential lines 610 having such a shape, the liquid crystal cannot perform a standard horizontal rotation about the equipotential lines 609 described in FIG. 21, and cannot ensure a sufficient transmittance for a liquid crystal display device.

In addition, when a pointer such as a finger having electrical charges touches a display surface of the color filter substrate 500, the horizontal alignment liquid crystal molecules may rise toward the pointer. The liquid crystal molecules have different dielectric constants between the long axis direction (rise direction) and short axis direction, and the capacitance of the display pixel varies. Accordingly, when a transparent electrode of a size containing a display pixel is used as a capacitive element for touch sensing (drive electrode or detection electrode), capacitance fluctuation of the display pixel causes touch capacitance fluctuation (noise).

The techniques disclosed in PTL 2 and PTL 3 involve such a risk of noise. Therefore, the touch sensor disclosed in PTL 2 and PTL 3 has the problem described above when applied to an FFS mode liquid crystal display device.

On the other hand, the fourth black matrix substrate 403 according to the fourth embodiment can adopt a structure in which a transparent electrode having a size corresponding to the pixel is not provided in the opening 9. Accordingly, the liquid crystal molecules do not rise toward the transparent electrode as described above. Further, capacitance fluctuation of the display pixel, which may be a problem in PTL 2 and PTL 3, does not occur. The fourth black matrix substrate 403 according to the fourth embodiment can be applied not only to FFS mode liquid crystal display devices, but also other display devices. Furthermore, in the embodiment described above, a transparent electrode is not used as a touch capacitance element.

In the fourth embodiment, since a conductive member (conductor) such as a transparent electrode is not provided on the surfaces of the color filters including the red pixel R, the green pixel G, and the blue pixel B, which are in contact with the liquid crystal layer 60, the transmittance of the FFS mode liquid crystal layer 60 is not greatly affected, and the liquid crystal display with high transmittance can be provided.

The black matrix substrate according to the above embodiments or the display device having the black matrix substrate can be implemented for various applications. Examples of electronics to which the display device according to the above embodiments can be applied include mobile phones, portable game machines, portable information terminals, personal computers, electronic books, video cameras, digital still cameras, head mounted displays, navigation systems, sound reproduction devices (car audio systems, digital audio players, and the like), copiers, facsimiles, printers, multifunction printers, vending machines, automated teller machines (ATM), personal identification devices, optical communication devices, and electronic devices such as IC cards. The embodiments described above can be used in any combination.

Preferred embodiments of the present invention have so far been described. These embodiments are, however, only examples and should not be taken as limiting the invention. Additions, omissions, substitutions, and other changes may be made without departing from the scope of the invention. Therefore, the invention should not be construed as being limited by the foregoing description, but as being defined by the claims.

The present invention has an aspect to provide a black matrix substrate having a touch sensing function capable of fingerprint authentication and the like by detecting ridges and valleys of a fingerprint, in addition to general touch sensing with a pointer such as a finger or a pen. The present invention has another aspect to provide a display device using the black matrix substrate. Further, the present invention has still another aspect to provide a black matrix substrate having a simplified configuration without using a transparent conductive film (transparent electrode) and an additional member.

A first aspect of the present invention is a black matrix substrate including: a transparent substrate having a first surface and a second surface; a black dielectric layer disposed on the second surface; a first insulating layer disposed on the black dielectric layer; a first conductive layer disposed on the first insulating layer, the first conductive layer including a first conductive pattern having a configuration in which a metal layer or an alloy layer is sandwiched between conductive oxide layers; a second insulating layer disposed on the first conductive pattern; an oxide semiconductor layer disposed on the second insulating layer; a second conductive layer disposed on the oxide semiconductor layer and the second insulating layer, the second conductive layer including a second conductive pattern having a configuration in which a metal layer or an alloy layer is sandwiched between conductive oxide layers; a transparent resin layer disposed on the second conductive pattern; a light-absorbing layer disposed on the transparent resin layer; and a first thin film transistor including a first gate electrode, a first source electrode, a first drain electrode, a first channel layer, and a gate insulating layer, wherein the black dielectric layer contains carbon, and is formed to cover the first conductive pattern and the second conductive pattern in plan view perpendicular to the first surface, the light-absorbing layer contains carbon, and is formed to cover the first conductive pattern and the second conductive pattern in plan view perpendicular to the second surface, part of the first conductive pattern constitutes the first gate electrode, part of the second conductive pattern constitutes the first source electrode and the first drain electrode, part of the oxide semiconductor layer constitutes the first channel layer, part of the first conductive pattern constitutes a scanning line through which the first thin film transistor is driven, part of the second conductive pattern constitutes an output line of the first thin film transistor, part of the first conductive pattern constitutes a capacitor pattern connected to the first gate electrode, the capacitor pattern includes at least one first opening in plan view, and part of the second insulating layer constitutes the gate insulating layer.

The black matrix substrate according to the first aspect of the present invention may further include a second thin film transistor including a second gate electrode electrically connected to the first gate electrode, a second source electrode, a second drain electrode electrically connected to the second gate electrode, a second channel layer, and a gate insulating layer, wherein part of the first conductive pattern may constitute the second gate electrode, part of the second conductive pattern may constitute the second source electrode and the second drain electrode, part of the oxide semiconductor layer may constitute the second channel layer, and part of the second insulating layer may constitute the gate insulating layer of the second thin film transistor.

In the black matrix substrate according to the first aspect of the present invention, the scanning line may extend parallel to a first direction in plan view, the output line may extend parallel to a second direction, which is perpendicular to the first direction, and the capacitor pattern may be disposed in a region defined by the scanning line and the output line.

In the black matrix substrate according to the first aspect of the present invention, the first opening may have a rectangular or parallelogram shape. The black dielectric layer and the light-absorbing layer may have a second opening having a shape similar to the first opening. A center of the second opening may overlap a center of the first opening.

In the black matrix substrate according to the first aspect of the present invention, the black dielectric layer may be a resin dispersion containing carbon and fine particles of a dielectric composed of at least metal oxide.

In the black matrix substrate according to the first aspect of the present invention, the dielectric composed of metal oxide may include fine particles of at least one paraelectric material selected from the group consisting of forsterite, aluminum oxide, and titanium oxide.

In the black matrix substrate according to the first aspect of the present invention, the black dielectric layer may contain carbon and fine particles of at least one selected from the group consisting of titanium oxide, titanium nitride, and titanium oxynitride.

In the black matrix substrate according to the first aspect of the present invention, the black dielectric layer may be composed of two layers of resin dispersions having different carbon concentrations, and at least one of the two layers of resin dispersions contains a dielectric composed of metal oxide.

In the black matrix substrate according to the first aspect of the present invention, the conductive oxide layer may contain indium oxide.

In the black matrix substrate according to the first aspect of the present invention, the oxide semiconductor layer may contain indium oxide and at least one of antimony oxide and bismuth oxide.

In the black matrix substrate according to the first aspect of the present invention, the oxide semiconductor layer may contain at least one of cerium oxide and tin oxide.

A second aspect of the present invention is a display device including: the black matrix substrate according to the first aspect; an array substrate having a substrate surface on which a thin film transistor array is disposed; and a display functional layer, wherein a second surface of the black matrix substrate and the substrate surface of the array substrate are bonded to each other with the display functional layer therebetween.

The above aspects of the present invention provide a black matrix substrate having a touch sensing function capable of fingerprint authentication and the like by detecting ridges and valleys of a fingerprint in addition to general touch sensing with a pointer such as a finger or a pen, and provide a display device using the black matrix substrate. Further, the above aspects of the present invention provide a black matrix substrate having a simplified configuration without using a transparent conductive film (transparent electrode) and an additional member.

REFERENCE SIGNS LIST

1 . . . First surface
2 . . . Second surface
3 . . . Black dielectric layer
4 . . . Conductive oxide layer
5 . . . Metal layer
6 . . . Low concentration carbon layer
7 . . . Conductive layer
8 . . . Light-absorbing layer
9 . . . Opening (first opening)
10 . . . First conductive pattern
11 . . . First gate electrode
12, 12' . . . Capacitor pattern
13 . . . Scanning line 15 . . . Reset line
16 . . . First channel layer
17 . . . First insulating layer
19 . . . Partitioned region
20 . . . Second conductive pattern
21 . . . Output line
22 . . . First source electrode
23 . . . First drain electrode
24A . . . Second channel layer
24B . . . Gate insulating layer
25 . . . Second source electrode
26 . . . Second drain electrode
27 . . . Second gate electrode
28 . . . Source extension line
29, 93 . . . Contact hole
31 . . . First thin film transistor
32 . . . Reset transistor
33 . . . Incident light
34 . . . Reflected light
37 . . . First transparent resin layer
38 . . . Second transparent resin layer
42 . . . Surface
45 . . . Sensor circuit
47 . . . Fourth insulating layer
48 . . . Second insulating layer
47 . . . Sixth insulating layer
51 . . . First power supply line
52 . . . Second power supply line
54 . . . Third source electrode
55 . . . Third gate electrode
56 . . . Third drain electrode
58 . . . Third channel layer
60, 607 . . . Liquid crystal layer
62, 606 . . . Substrate
63 . . . Capacitive element
65, 603, 604 . . . Insulating layer
66, 165 . . . Source wiring (third source wiring)
67 . . . Fourth thin film transistor (thin film transistor)
68 . . . Third thin film transistor (thin film transistor)
69, 164 . . . Gate wiring (third gate wiring)
70 . . . Fifth thin film transistor
71 . . . Overlapping portion
72 . . . Scan signal circuit
73 . . . Video signal circuit
74 . . . Corner
75 . . . Auxiliary conductor
76 . . . Transparent conductive film
77 . . . Joining layer
78 . . . Upper surface
79 . . . Capacitive element
80 . . . Organic EL layer
81 . . . Source signal circuit
82 . . . Scan driving circuit
86, CHIP . . . light emitting element
87 . . . Upper electrode
88, 189 . . . Lower electrode
89 . . . Reflective electrode
90 . . . N-type semiconductor layer
91 . . . P-type semiconductor layer
92 . . . Light emitting layer
94 . . . Bank
95 . . . Second flattening layer
96 . . . First flattening layer
100 . . . Black matrix substrate
102, 501 . . . Transparent substrate
108 . . . Adhesive layer
109, 195 . . . Sealing layer
148 . . . Third insulating layer
155 . . . Fifth gate electrode
156 . . . Fifth drain electrode
161, 162 . . . Superposed region
171 . . . Sixth thin film transistor
191 . . . Hole injection layer
200 . . . Micro LED display device
201 . . . Second array substrate
202 . . . Second substrate
248 . . . Fifth insulating layer
300 . . . Organic EL display device
301 . . . Third array substrate
302 . . . Third substrate
303 . . . Third black matrix substrate
400, 700, 800 . . . Liquid crystal display device
401 . . . Fourth array substrate
403 . . . Fourth black matrix substrate
500 . . . Color filter substrate
601 . . . Pixel electrode
602 . . . Common electrode
605 . . . Array substrate
609, 610 . . . Equipotential lines
612 . . . Transparent electrode
614 . . . Transparent resin layer
B . . . Blue pixel
B1, B2, B3 . . . Conductive wire
CF . . . Color filter
F . . . Finger
G . . . Green pixel
OP . . . opening (second opening)
PX . . . Pixel (pixel opening)
R . . . Red pixel
SU, SU1, SU2 . . . Sensor unit Obviously, numerous modifications and variations of the present invention are possible in light of the above teachings. It is therefore to be understood that within the scope of the appended claims, the invention may be practiced otherwise than as specifically described herein.

What is claimed is:
1. A black matrix substrate, comprising:
a transparent substrate having a first surface and a second surface opposite to the first surface;
a black dielectric layer formed on the second surface;
a first insulating layer formed on the black dielectric layer;
a first conductive layer formed on the first insulating layer and including a first conductive pattern that includes a metal layer or an alloy layer sandwiched between conductive oxide layers;
a second insulating layer formed on the first conductive pattern;
an oxide semiconductor layer formed on the second insulating layer;
a second conductive layer formed on the oxide semiconductor layer and the second insulating layer, the second conductive layer including a second conductive pattern that includes a metal layer or an alloy layer sandwiched between conductive oxide layers;
a transparent resin layer formed on the second conductive pattern;
a light-absorbing layer formed on the transparent resin layer; and
a first thin film transistor including a first gate electrode, a first source electrode, a first drain electrode, a first channel layer, and a gate insulating layer, wherein the black dielectric layer comprises carbon and covers the first conductive pattern and the second conductive pattern in a plan view perpendicular to the first surface, the light-absorbing layer comprises carbon and covers the first conductive pattern and the second conductive pattern in a plan view perpendicular to the second surface, the first gate electrode is a portion of the first conductive pattern, the first source electrode and the first drain electrode are portions of the second conductive pattern, the first channel layer is a portion of the oxide semiconductor layer, and the gate insulating layer is a portion of the second insulating layer.

2. The black matrix substrate according to claim 1, further comprising:

a second thin film transistor including a second gate electrode electrically connected to the first gate electrode, a second source electrode, a second drain electrode electrically connected to the second gate electrode, a second channel layer, and a gate insulating layer, wherein the second gate electrode is a portion of the first conductive pattern, the second source electrode and the second drain electrode are portions of the second conductive pattern, the second channel layer is a portion of the oxide semiconductor layer, and the gate insulating layer of the second thin film transistor is a portion of the second insulating layer.

3. The black matrix substrate according to claim 1, wherein the first conductive pattern has a portion that forms a scanning line through which the first thin film transistor is driven, the second conductive pattern has a portion that forms an output line of the first thin film transistor, the first conductive pattern has a portion that forms a capacitor pattern connected to the first gate electrode, the scanning line extends parallel to a first direction in a plan view, the output line extends parallel to a second direction, which is perpendicular to the first direction, and the capacitor pattern is formed in a region defined by the scanning line and the output line.

4. The black matrix substrate according to claim 1, wherein the first conductive pattern has a portion that forms a capacitor pattern connected to the first gate electrode, the capacitor pattern includes at least one first opening in plan a view, the first opening has a rectangular or parallelogram shape, the black dielectric layer and the light-absorbing layer have a second opening having a shape similar to the first opening, and the second opening has a center that overlaps with a center of the first opening.

5. The black matrix substrate according to claim 1, wherein the black dielectric layer is a resin dispersion including carbon and a plurality of fine particles of a dielectric material comprising a metal oxide.

6. The black matrix substrate according to claim 5, wherein the dielectric material includes fine particles of at least one paraelectric material selected from the group consisting of forsterite, aluminum oxide, and titanium oxide.

7. The black matrix substrate according to claim 1, wherein the black dielectric layer comprises carbon and a plurality of fine particles of at least one selected from the group consisting of titanium oxide, titanium nitride, and titanium oxynitride.

8. The black matrix substrate according to claim 1, wherein the black dielectric layer includes two layers of resin dispersions having different carbon concentrations, and at least one of the two layers includes a dielectric material comprising a metal oxide.

9. The black matrix substrate according to claim 1, wherein the conductive oxide layer comprises indium oxide.

10. The black matrix substrate according to claim 1, wherein the oxide semiconductor layer comprises indium oxide and at least one of antimony oxide and bismuth oxide.

11. The black matrix substrate according to claim 10, wherein the oxide semiconductor layer comprises at least one of cerium oxide and tin oxide.

12. A display device, comprising:

the black matrix substrate of claim 1;

an array substrate having a thin film transistor array formed thereon; and a display functional layer formed between the black matrix substrate and the array substrate.

* * * * *